US008860594B2

(12) United States Patent
Hansen

(10) Patent No.: US 8,860,594 B2
(45) Date of Patent: Oct. 14, 2014

(54) SYSTEM AND METHOD FOR DIGITAL SIGNALING

(75) Inventor: Karl Christopher Hansen, Amherst, NH (US)

(73) Assignee: Brilliant Points, Inc., Reno, NV (US)

(*) Notice: Subject to any disclaimer, the term of this patent is extended or adjusted under 35 U.S.C. 154(b) by 415 days.

(21) Appl. No.: 13/474,069

(22) Filed: May 17, 2012

(65) Prior Publication Data
US 2013/0308718 A1 Nov. 21, 2013

(51) Int. Cl.
H03M 1/66 (2006.01)
H04L 25/02 (2006.01)
H04L 27/34 (2006.01)

(52) U.S. Cl.
CPC ........ *H04L 25/0228* (2013.01); *H04L 27/3444* (2013.01)
USPC ............................................. 341/144; 341/58

(58) Field of Classification Search
CPC ................... H04L 25/0228; H04L 2027/0067; H04L 27/3444
USPC ........................................ 341/57, 144, 56, 58
See application file for complete search history.

(56) References Cited

U.S. PATENT DOCUMENTS

| | | | |
|---|---|---|---|
| 3,671,671 A | 6/1972 | Watanabe | |
| 3,731,199 A | 5/1973 | Tazaki et al. | |
| 3,835,252 A | 9/1974 | Ananiades et al. | |
| 3,943,284 A | 3/1976 | Nelson | |
| 3,983,323 A | 9/1976 | Griffith et al. | |
| 4,205,203 A * | 5/1980 | Mehta et al. | 370/525 |
| 4,280,221 A | 7/1981 | Chun et al. | |
| 4,380,060 A | 4/1983 | Wilhelm | |
| 4,525,845 A | 6/1985 | Dodds et al. | |
| 4,581,691 A | 4/1986 | Hock | |
| 4,825,450 A | 4/1989 | Herzog | |
| 5,160,929 A | 11/1992 | Costello | |
| 5,172,338 A | 12/1992 | Mehrotra et al. | |

(Continued)

FOREIGN PATENT DOCUMENTS

| | | |
|---|---|---|
| DE | 2940140 B1 | 10/1979 |
| EP | 0352869 A2 | 1/1990 |

(Continued)

OTHER PUBLICATIONS

Ravi Kollipara, et al., "A Way to Meet Bandwidth and Capacity Needs of Next Generation Main Memory Systems", DesignCon 2011.

(Continued)

*Primary Examiner* — Peguy Jean Pierre
(74) *Attorney, Agent, or Firm* — Brooks Kushman P.C.

(57) ABSTRACT

Systems and methods for communicating digital data associated with amplitudes and phases of a virtual periodic waveform having a designated period between components connected by n conductors include, in one embodiment, circuitry that converts a first amplitude and a first phase to a first corresponding voltage or current and applies the first corresponding voltage or current to a first one of the plurality of conductors, and converts the first amplitude and the first phase to (n–1) corresponding voltages or currents based on amplitudes of the periodic waveform phase shifted by about m*(360/n) relative to the first phase where m is indexed from one to (n–1) and applies each corresponding voltage or current to an associated conductor of the plurality of conductors. The systems and methods are particularly suited for reducing the number of conductors to obtain a desired I/O data rate/throughput for integrated circuit chips and wired networks.

31 Claims, 15 Drawing Sheets

(56) References Cited

U.S. PATENT DOCUMENTS

| | | |
|---|---|---|
| 5,235,617 A | 8/1993 | Mallard, Jr. |
| 5,255,287 A | 10/1993 | Davies et al. |
| 5,259,002 A | 11/1993 | Carlstedt |
| 5,341,419 A | 8/1994 | Ferry |
| 5,412,689 A | 5/1995 | Can et al. |
| 5,418,504 A | 5/1995 | Nottenburg |
| 5,553,097 A | 9/1996 | Dagher |
| 5,566,125 A | 10/1996 | Fazio et al. |
| 5,761,246 A | 6/1998 | Cao et al. |
| 5,790,607 A | 8/1998 | Burke et al. |
| 6,005,895 A | 12/1999 | Perino et al. |
| 6,922,160 B1 | 7/2005 | Brown |
| 7,002,490 B2 | 2/2006 | Lablans |
| 7,064,684 B2 | 6/2006 | Lablans |
| 7,218,144 B2 | 5/2007 | Lablans |
| 7,227,030 B2 | 6/2007 | Saka |
| 7,239,254 B1 * | 7/2007 | Kareenahalli et al. ........ 341/100 |
| 7,355,444 B2 | 4/2008 | Lablans |
| 7,365,576 B2 | 4/2008 | Lablans |
| 7,397,690 B2 | 7/2008 | Lablans |
| 7,487,194 B2 | 2/2009 | Lablans |
| 7,505,589 B2 | 3/2009 | Lablans |
| 7,548,092 B2 | 6/2009 | Lablans |
| 7,562,106 B2 | 7/2009 | Lablans |
| 7,580,472 B2 | 8/2009 | Lablans |
| 7,636,396 B1 | 12/2009 | Weber, Jr. et al. |
| 7,643,632 B2 | 1/2010 | Lablans |
| 7,656,196 B2 | 2/2010 | Lablans |
| 7,659,839 B2 | 2/2010 | Lablans |
| 7,722,999 B2 | 5/2010 | Levy et al. |
| 7,725,779 B2 | 5/2010 | Lablans |
| 7,728,816 B2 | 6/2010 | Xu et al. |
| 7,729,454 B2 * | 6/2010 | Chang et al. ................. 375/324 |
| 2007/0005673 A1 | 1/2007 | Lablans |
| 2007/0098160 A1 | 5/2007 | Lablans |
| 2007/0110229 A1 | 5/2007 | Lablans |
| 2007/0208796 A1 | 9/2007 | Lablans |
| 2007/0226594 A1 | 9/2007 | Lablans |
| 2007/0258516 A1 | 11/2007 | Lablans |
| 2008/0016431 A1 | 1/2008 | Lablans |
| 2008/0016432 A1 | 1/2008 | Lablans |
| 2008/0040650 A1 | 2/2008 | Lablans |
| 2008/0104479 A1 | 5/2008 | Lablans |
| 2008/0244274 A1 | 10/2008 | Lablans |
| 2009/0040062 A1 | 2/2009 | Lang et al. |
| 2009/0045988 A1 | 2/2009 | Lablans |
| 2009/0060202 A1 | 3/2009 | Lablans |
| 2009/0077151 A1 | 3/2009 | Lablans |
| 2009/0092250 A1 | 4/2009 | Lablans |
| 2009/0138535 A1 | 5/2009 | Lablans |
| 2009/0172501 A1 | 7/2009 | Lablans |
| 2009/0234900 A1 | 9/2009 | Lablans |
| 2011/0013726 A1 | 1/2011 | Voinigescu et al. |
| 2011/0255870 A1 | 10/2011 | Grigoryan et al. |

FOREIGN PATENT DOCUMENTS

| | | |
|---|---|---|
| EP | 0421601 | 4/1991 |
| EP | 1257102 | 11/2002 |
| EP | 1374441 | 1/2004 |
| EP | 2218173 | 8/2010 |

OTHER PUBLICATIONS

Gary Breed, "Analyzing Signals using the Eye Diagram", High Frequency Electronics, Nov. 2005, pp. 50-53, Summit Technical Media.
Performance Graphics Memory Interface Solution, Rambus, GDDR Memory Controller Interface Brief, (c) 2005.
Wikipedia, Interconnect bottleneck, "http://en.wikipedia.org/w/index.php? title=Interconnect_bottleneck&oldid=419137288"; Jan. 30, 2012.
Wikipedia, Quadrature amplitude modulation, "http://en.wikipedia.org/wiki/QAM", Feb. 1, 2012.
Rambus, XDR IO Cell,Advance Information, Rambus Confidential, Version 0.71, pp. 1-140, (c) 2002-2005.
Wikipedia, XDR DRAM, "http://en.wikipedia.org/wiki/XDR_DRAM", Jan. 30, 2012.
XAUI interface—Introduction to XAUI—Carrier Metro Ethernet Broadband, www.10gea.org/xaui-interface-introduction-to-xaui/, Feb. 1, 2012, pp. 1-8.
Wikipedia, XAUI, "http://en.wikipedia.org/wiki/XAUI", pp. 1-3, Feb. 1, 2012.
International Search Report and Written Opinion mailed Aug. 24, 2013 for International Application PCT/US2013-039390 filed May 3, 2013.

* cited by examiner

| AMP | PHASE | Q | R (+120) | S (-120) | Q-R (QR) | S-Q (SQ) | R-S (RS) |
|---|---|---|---|---|---|---|---|
| 0.25 | 30 | 0.125 | 0.125 | -0.25 | 0 | -0.375 | 0.375 |
| 0.25 | 75 | 0.241481 | -0.0647 | -0.17678 | 0.306186 | -0.41826 | 0.112072 |
| 0.25 | 120 | 0.216506 | -0.21651 | 0 | 0.433013 | -0.21651 | -0.21651 |
| 0.25 | 165 | 0.064705 | -0.24148 | 0.176777 | 0.306186 | 0.112072 | -0.41826 |
| 0.25 | 210 | -0.125 | -0.125 | 0.25 | 0 | 0.375 | -0.375 |
| 0.25 | 255 | -0.24148 | 0.064705 | 0.176777 | -0.30619 | 0.418258 | -0.11207 |
| 0.25 | 300 | -0.21651 | 0.216506 | 3.06E-17 | -0.43301 | 0.216506 | 0.216506 |
| 0.25 | 345 | -0.0647 | 0.241481 | -0.17678 | -0.30619 | -0.11207 | 0.418258 |
| 0.5 | 30 | 0.25 | 0.25 | -0.5 | 0 | -0.75 | 0.75 |
| 0.5 | 75 | 0.482963 | -0.12941 | -0.35355 | 0.612372 | -0.83652 | 0.224144 |
| 0.5 | 120 | 0.433013 | -0.43301 | 0 | 0.866025 | -0.43301 | -0.43301 |
| 0.5 | 165 | 0.12941 | -0.48296 | 0.353553 | 0.612372 | 0.224144 | -0.83652 |
| 0.5 | 210 | -0.25 | -0.25 | 0.5 | 0 | 0.75 | -0.75 |
| 0.5 | 255 | -0.48296 | 0.12941 | 0.353553 | -0.61237 | 0.836516 | -0.22414 |
| 0.5 | 300 | -0.43301 | 0.433013 | 6.13E-17 | -0.86603 | 0.433013 | 0.433013 |
| 0.5 | 345 | -0.12941 | 0.482963 | -0.35355 | -0.61237 | -0.22414 | 0.836516 |
| 0.75 | 30 | 0.375 | 0.375 | -0.75 | 0 | -1.125 | 1.125 |
| 0.75 | 75 | 0.724444 | -0.19411 | -0.53033 | 0.918559 | -1.25477 | 0.336216 |
| 0.75 | 120 | 0.649519 | -0.64952 | 0 | 1.299038 | -0.64952 | -0.64952 |
| 0.75 | 165 | 0.194114 | -0.72444 | 0.53033 | 0.918559 | 0.336216 | -1.25477 |
| 0.75 | 210 | -0.375 | -0.375 | 0.75 | 0 | 1.125 | -1.125 |
| 0.75 | 255 | -0.72444 | 0.194114 | 0.53033 | -0.91856 | 1.254774 | -0.33622 |
| 0.75 | 300 | -0.64952 | 0.649519 | 9.19E-17 | -1.29904 | 0.649519 | 0.649519 |
| 0.75 | 345 | -0.19411 | 0.724444 | -0.53033 | -0.91856 | -0.33622 | 1.254774 |
| 1 | 30 | 0.5 | 0.5 | -1 | 0 | -1.5 | 1.5 |
| 1 | 75 | 0.965926 | -0.25882 | -0.70711 | 1.224745 | -1.67303 | 0.448288 |
| 1 | 120 | 0.866025 | -0.86603 | 0 | 1.732051 | -0.86603 | -0.86603 |
| 1 | 165 | 0.258819 | -0.96593 | 0.707107 | 1.224745 | 0.448288 | -1.67303 |
| 1 | 210 | -0.5 | -0.5 | 1 | 0 | 1.5 | -1.5 |
| 1 | 255 | -0.96593 | 0.258819 | 0.707107 | -1.22474 | 1.673033 | -0.44829 |
| 1 | 300 | -0.86603 | 0.866025 | 1.23E-16 | -1.73205 | 0.866025 | 0.866025 |
| 1 | 345 | -0.25882 | 0.965926 | -0.70711 | -1.22474 | -0.44829 | 1.673033 |

FIG. 10A

| qr1 | sq1 | rs1 | MAX | MIN | DEL+ | DEL- | BITS | QR MATCH SET | SQ MATCH SET | RS MATCH SET |
|---|---|---|---|---|---|---|---|---|---|---|
| 6 | 4 | 8 | 8 | 4 | 0.6 | 0.45 | 00000 | 111111000000 | 111100000000 | 111111110000 |
| 8 | 4 | 7 | 8 | 4 | 0.6 | 0.45 | 00001 | 111111110000 | 111100000000 | 111111100000 |
| 8 | 5 | 5 | 8 | 5 | 0.45 | 0.3 | 00010 | 111111110000 | 111110000000 | 111110000000 |
| 8 | 7 | 4 | 8 | 4 | 0.6 | 0.45 | 00011 | 111111110000 | 111111100000 | 111100000000 |
| 6 | 8 | 4 | 8 | 4 | 0.6 | 0.45 | 00100 | 111111000000 | 111111110000 | 111100000000 |
| 4 | 8 | 5 | 8 | 4 | 0.6 | 0.45 | 00101 | 111100000000 | 111111110000 | 111110000000 |
| 4 | 7 | 7 | 7 | 4 | 0.45 | 0.3 | 00110 | 111100000000 | 111111100000 | 111111100000 |
| 4 | 5 | 8 | 8 | 4 | 0.6 | 0.45 | 00111 | 111100000000 | 111110000000 | 111111110000 |
| 6 | 3 | 9 | 9 | 3 | 0.9 | 0.75 | 01000 | 111111000000 | 111000000000 | 111111111000 |
| 9 | 3 | 7 | 9 | 3 | 0.9 | 0.75 | 01001 | 111111111000 | 111000000000 | 111111100000 |
| 9 | 4 | 4 | 9 | 4 | 0.75 | 0.6 | 01010 | 111111111000 | 111100000000 | 111100000000 |
| 9 | 7 | 3 | 9 | 3 | 0.9 | 0.75 | 01011 | 111111111000 | 111111100000 | 111000000000 |
| 6 | 9 | 3 | 9 | 3 | 0.9 | 0.75 | 01100 | 111111000000 | 111111111000 | 111000000000 |
| 3 | 9 | 5 | 9 | 3 | 0.9 | 0.75 | 01101 | 111000000000 | 111111111000 | 111110000000 |
| 3 | 8 | 8 | 8 | 3 | 0.75 | 0.6 | 01110 | 111000000000 | 111111110000 | 111111110000 |
| 3 | 5 | 9 | 9 | 3 | 0.9 | 0.75 | 01111 | 111000000000 | 111110000000 | 111111111000 |
| 6 | 2 | 10 | 10 | 2 | 1.2 | 1.05 | 10000 | 111111000000 | 110000000000 | 111111111100 |
| 9 | 1 | 8 | 9 | 1 | 1.2 | 1.05 | 10001 | 111111111000 | 100000000000 | 111111110000 |
| 11 | 3 | 3 | 11 | 3 | 1.2 | 1.05 | 10010 | 111111111110 | 111000000000 | 111000000000 |
| 9 | 8 | 1 | 9 | 1 | 1.2 | 1.05 | 10011 | 111111111000 | 111111110000 | 100000000000 |
| 6 | 10 | 2 | 10 | 2 | 1.2 | 1.05 | 10100 | 111111000000 | 111111111100 | 110000000000 |
| 3 | 11 | 4 | 11 | 3 | 1.2 | 1.05 | 10101 | 111000000000 | 111111111110 | 111100000000 |
| 1 | 9 | 9 | 9 | 1 | 1.2 | 1.05 | 10110 | 100000000000 | 111111111000 | 111111111000 |
| 3 | 4 | 11 | 11 | 3 | 1.2 | 1.05 | 10111 | 111000000000 | 111100000000 | 111111111110 |
| 6 | 0 | 12 | 12 | 0 | 1.8 | 1.65 | 11000 | 111111000000 | 000000000000 | 111111111111 |
| 11 | 0 | 8 | 11 | 0 | 1.65 | 1.5 | 11001 | 111111111110 | 000000000000 | 111111110000 |
| 12 | 3 | 3 | 12 | 3 | 1.35 | 1.2 | 11010 | 111111111111 | 111000000000 | 111000000000 |
| 11 | 8 | 0 | 11 | 0 | 1.65 | 1.5 | 11011 | 111111111110 | 111111110000 | 000000000000 |
| 6 | 12 | 0 | 12 | 0 | 1.8 | 1.65 | 11100 | 111111000000 | 111111111111 | 000000000000 |
| 1 | 12 | 4 | 12 | 1 | 1.65 | 1.5 | 11101 | 100000000000 | 111111111111 | 111100000000 |
| 0 | 9 | 9 | 9 | 0 | 1.35 | 1.2 | 11110 | 000000000000 | 111111111000 | 111111111000 |
| 1 | 4 | 12 | 12 | 1 | 1.65 | 1.5 | 11111 | 100000000000 | 111100000000 | 111111111111 |

FIG. 10B

| qr1 | sq1 | rs1 | BITS |
|---|---|---|---|
| 0 | 9 | 9 | 11110 |
| 1 | 4 | 12 | 11111 |
| 1 | 9 | 9 | 10110 |
| 1 | 12 | 4 | 11101 |
| 3 | 4 | 11 | 10111 |
| 3 | 5 | 9 | 01111 |
| 3 | 8 | 8 | 01110 |
| 3 | 9 | 5 | 01101 |
| 3 | 11 | 4 | 10101 |
| 4 | 5 | 8 | 00111 |
| 4 | 7 | 7 | 00110 |
| 4 | 8 | 5 | 00101 |
| 6 | 0 | 12 | 11000 |
| 6 | 2 | 10 | 10000 |
| 6 | 3 | 9 | 01000 |
| 6 | 4 | 8 | 00000 |
| 6 | 8 | 4 | 00100 |
| 6 | 9 | 3 | 01100 |
| 6 | 10 | 2 | 10100 |
| 6 | 12 | 0 | 11100 |
| 8 | 4 | 7 | 00001 |
| 8 | 5 | 5 | 00010 |
| 8 | 7 | 4 | 00011 |
| 9 | 1 | 8 | 10001 |
| 9 | 3 | 7 | 01001 |
| 9 | 4 | 4 | 01010 |
| 9 | 7 | 3 | 01011 |
| 9 | 8 | 1 | 10011 |
| 11 | 0 | 8 | 11001 |
| 11 | 3 | 3 | 10010 |
| 11 | 8 | 0 | 11011 |
| 12 | 3 | 3 | 11010 |

FIG. 10C

| AMP | PHASE | Q | R (+90) | S (+180) | T (-90) | Q-R (QR) | R-S (RS) | S-T (ST) | T-Q (TQ) |
|---|---|---|---|---|---|---|---|---|---|
| 0.25 | 30 | 0.125 | 0.216506 | -0.125 | -0.21651 | -0.09151 | 0.341506 | 0.091506 | -0.34151 |
| 0.25 | 75 | 0.241481 | 0.064705 | -0.24148 | -0.0647 | 0.176777 | 0.306186 | -0.17678 | -0.30619 |
| 0.25 | 120 | 0.216506 | -0.125 | -0.21651 | 0.125 | 0.341506 | 0.091506 | -0.34151 | -0.09151 |
| 0.25 | 165 | 0.064705 | -0.24148 | -0.0647 | 0.241481 | 0.306186 | -0.17678 | -0.30619 | 0.176777 |
| 0.25 | 210 | -0.125 | -0.21651 | 0.125 | 0.216506 | 0.091506 | -0.34151 | -0.09151 | 0.341506 |
| 0.25 | 255 | -0.24148 | -0.0647 | 0.241481 | 0.064705 | -0.17678 | -0.30619 | 0.176777 | 0.306186 |
| 0.25 | 300 | -0.21651 | 0.125 | 0.216506 | -0.125 | -0.34151 | -0.09151 | 0.341506 | 0.091506 |
| 0.25 | 345 | -0.0647 | 0.241481 | 0.064705 | -0.24148 | -0.30619 | 0.176777 | 0.306186 | -0.17678 |
| 0.5 | 30 | 0.25 | 0.433013 | -0.25 | -0.43301 | -0.18301 | 0.683013 | 0.183013 | -0.68301 |
| 0.5 | 75 | 0.482963 | 0.12941 | -0.48296 | -0.12941 | 0.353553 | 0.612372 | -0.35355 | -0.61237 |
| 0.5 | 120 | 0.433013 | -0.25 | -0.43301 | 0.25 | 0.683013 | 0.183013 | -0.68301 | -0.18301 |
| 0.5 | 165 | 0.12941 | -0.48296 | -0.12941 | 0.482963 | 0.612372 | -0.35355 | -0.61237 | 0.353553 |
| 0.5 | 210 | -0.25 | -0.43301 | 0.25 | 0.433013 | 0.183013 | -0.68301 | -0.18301 | 0.683013 |
| 0.5 | 255 | -0.48296 | -0.12941 | 0.482963 | 0.12941 | -0.35355 | -0.61237 | 0.353553 | 0.612372 |
| 0.5 | 300 | -0.43301 | 0.25 | 0.433013 | -0.25 | -0.68301 | -0.18301 | 0.683013 | 0.183013 |
| 0.5 | 345 | -0.12941 | 0.482963 | 0.12941 | -0.48296 | -0.61237 | 0.353553 | 0.612372 | -0.35355 |
| 0.75 | 30 | 0.375 | 0.649519 | -0.375 | -0.64952 | -0.27452 | 1.024519 | 0.274519 | -1.02452 |
| 0.75 | 75 | 0.724444 | 0.194114 | -0.72444 | -0.19411 | 0.53033 | 0.918559 | -0.53033 | -0.91856 |
| 0.75 | 120 | 0.649519 | -0.375 | -0.64952 | 0.375 | 1.024519 | 0.274519 | -1.02452 | -0.27452 |
| 0.75 | 165 | 0.194114 | -0.72444 | -0.19411 | 0.724444 | 0.918559 | -0.53033 | -0.91856 | 0.53033 |
| 0.75 | 210 | -0.375 | -0.64952 | 0.375 | 0.649519 | 0.274519 | -1.02452 | -0.27452 | 1.024519 |
| 0.75 | 255 | -0.72444 | -0.19411 | 0.724444 | 0.194114 | -0.53033 | -0.91856 | 0.53033 | 0.918559 |
| 0.75 | 300 | -0.64952 | 0.375 | 0.649519 | -0.375 | -1.02452 | -0.27452 | 1.024519 | 0.274519 |
| 0.75 | 345 | -0.19411 | 0.724444 | 0.194114 | -0.72444 | -0.91856 | 0.53033 | 0.918559 | -0.53033 |
| 1 | 30 | 0.5 | 0.866025 | -0.5 | -0.86603 | -0.36603 | 1.366025 | 0.366025 | -1.36603 |
| 1 | 75 | 0.965926 | 0.258819 | -0.96593 | -0.25882 | 0.707107 | 1.224745 | -0.70711 | -1.22474 |
| 1 | 120 | 0.866025 | -0.5 | -0.86603 | 0.5 | 1.366025 | 0.366025 | -1.36603 | -0.36603 |
| 1 | 165 | 0.258819 | -0.96593 | -0.25882 | 0.965926 | 1.224745 | -0.70711 | -1.22474 | 0.707107 |
| 1 | 210 | -0.5 | -0.86603 | 0.5 | 0.866025 | 0.366025 | -1.36603 | -0.36603 | 1.366025 |
| 1 | 255 | -0.96593 | -0.25882 | 0.965926 | 0.258819 | -0.70711 | -1.22474 | 0.707107 | 1.224745 |
| 1 | 300 | -0.86603 | 0.5 | 0.866025 | -0.5 | -1.36603 | -0.36603 | 1.366025 | 0.366025 |
| 1 | 345 | -0.25882 | 0.965926 | 0.258819 | -0.96593 | -1.22474 | 0.707107 | 1.224745 | -0.70711 |

FIG. 11A

| qr1 | rs1 | st1 | tq1 | BITS | QR MATCH SET | RS MATCH SET | ST MATCH SET | TQ MATCH SET |
|---|---|---|---|---|---|---|---|---|
| 6 | 7 | 6 | 5 | 00000 | 111111000000 | 111111100000 | 111111000000 | 111110000000 |
| 7 | 7 | 5 | 5 | 00001 | 111111100000 | 111111100000 | 111110000000 | 111110000000 |
| 7 | 6 | 5 | 6 | 00010 | 111111100000 | 111111000000 | 111110000000 | 111111000000 |
| 7 | 5 | 5 | 7 | 00011 | 111111100000 | 111110000000 | 111110000000 | 111111100000 |
| 6 | 5 | 6 | 7 | 00100 | 111111000000 | 111110000000 | 111111000000 | 111111100000 |
| 5 | 5 | 7 | 7 | 00101 | 111110000000 | 111110000000 | 111111100000 | 111111100000 |
| 5 | 6 | 7 | 6 | 00110 | 111110000000 | 111111000000 | 111111100000 | 111111000000 |
| 5 | 7 | 7 | 5 | 00111 | 111110000000 | 111111100000 | 111111100000 | 111110000000 |
| 5 | 8 | 7 | 4 | 01000 | 111110000000 | 111111110000 | 111111100000 | 111100000000 |
| 7 | 8 | 5 | 4 | 01001 | 111111100000 | 111111110000 | 111110000000 | 111100000000 |
| 8 | 7 | 4 | 5 | 01010 | 111111110000 | 111111100000 | 111100000000 | 111110000000 |
| 8 | 5 | 4 | 7 | 01011 | 111111110000 | 111110000000 | 111100000000 | 111111100000 |
| 7 | 4 | 5 | 8 | 01100 | 111111100000 | 111100000000 | 111110000000 | 111111110000 |
| 5 | 4 | 7 | 8 | 01101 | 111110000000 | 111100000000 | 111111100000 | 111111110000 |
| 4 | 5 | 8 | 7 | 01110 | 111100000000 | 111110000000 | 111111110000 | 111111100000 |
| 4 | 7 | 8 | 5 | 01111 | 111100000000 | 111111100000 | 111111110000 | 111110000000 |
| 5 | 10 | 7 | 2 | 10000 | 111110000000 | 111111111100 | 111111100000 | 110000000000 |
| 8 | 9 | 4 | 3 | 10001 | 111111110000 | 111111111000 | 111100000000 | 111000000000 |
| 10 | 7 | 2 | 5 | 10010 | 111111111100 | 111111100000 | 110000000000 | 111110000000 |
| 9 | 4 | 3 | 8 | 10011 | 111111111000 | 111100000000 | 111000000000 | 111111110000 |
| 7 | 2 | 5 | 10 | 10100 | 111111100000 | 110000000000 | 111110000000 | 111111111100 |
| 4 | 3 | 8 | 9 | 10101 | 111100000000 | 111000000000 | 111111110000 | 111111111000 |
| 2 | 5 | 10 | 7 | 10110 | 110000000000 | 111110000000 | 111111111100 | 111111100000 |
| 3 | 8 | 9 | 4 | 10111 | 111000000000 | 111111110000 | 111111111000 | 111100000000 |
| 5 | 11 | 7 | 1 | 11000 | 111110000000 | 111111111110 | 111111100000 | 100000000000 |
| 9 | 11 | 3 | 1 | 11001 | 111111111000 | 111111111110 | 111000000000 | 100000000000 |
| 11 | 7 | 1 | 5 | 11010 | 111111111110 | 111111100000 | 100000000000 | 111110000000 |
| 11 | 3 | 1 | 9 | 11011 | 111111111110 | 111000000000 | 100000000000 | 111111111000 |
| 7 | 1 | 5 | 11 | 11100 | 111111100000 | 100000000000 | 111110000000 | 111111111110 |
| 3 | 1 | 9 | 11 | 11101 | 111000000000 | 100000000000 | 111111111000 | 111111111110 |
| 1 | 5 | 11 | 7 | 11110 | 100000000000 | 111110000000 | 111111111110 | 111111100000 |
| 1 | 9 | 11 | 3 | 11111 | 100000000000 | 111111111000 | 111111111110 | 111000000000 |

FIG. 11B

| qr1 | rs1 | st1 | tq1 | BITS |
|---|---|---|---|---|
| 1 | 5 | 11 | 7 | 11110 |
| 1 | 9 | 11 | 3 | 11111 |
| 2 | 5 | 10 | 7 | 10110 |
| 3 | 1 | 9 | 11 | 11101 |
| 3 | 8 | 9 | 4 | 10111 |
| 4 | 3 | 8 | 9 | 10101 |
| 4 | 5 | 8 | 7 | 01110 |
| 4 | 7 | 8 | 5 | 01111 |
| 5 | 4 | 7 | 8 | 01101 |
| 5 | 5 | 7 | 7 | 00101 |
| 5 | 6 | 7 | 6 | 00110 |
| 5 | 7 | 7 | 5 | 00111 |
| 5 | 8 | 7 | 4 | 01000 |
| 5 | 10 | 7 | 2 | 10000 |
| 5 | 11 | 7 | 1 | 11000 |
| 6 | 5 | 6 | 7 | 00100 |
| 6 | 7 | 6 | 5 | 00000 |
| 7 | 1 | 5 | 11 | 11100 |
| 7 | 2 | 5 | 10 | 10100 |
| 7 | 4 | 5 | 8 | 01100 |
| 7 | 5 | 5 | 7 | 00011 |
| 7 | 6 | 5 | 6 | 00010 |
| 7 | 7 | 5 | 5 | 00001 |
| 7 | 8 | 5 | 4 | 01001 |
| 8 | 5 | 4 | 7 | 01011 |
| 8 | 7 | 4 | 5 | 01010 |
| 8 | 9 | 4 | 3 | 10001 |
| 9 | 4 | 3 | 8 | 10011 |
| 9 | 11 | 3 | 1 | 11001 |
| 10 | 7 | 2 | 5 | 10010 |
| 11 | 3 | 1 | 9 | 11011 |
| 11 | 7 | 1 | 5 | 11010 |

FIG. 11C

SYSTEM AND METHOD FOR DIGITAL SIGNALING

TECHNICAL FIELD

The present disclosure relates to systems and methods for digital signaling that may be used in a variety of applications including data input/output for integrated circuit chips and wired networking.

BACKGROUND

Decades of increases in transistor density on integrated circuit chips have far outpaced current strategies for getting information onto and off of the chips. The need to have a secure and reliable connection under a wide variety of operating conditions, while retaining the ability to assemble chips into larger modules, has placed hard minimums on the feature sizes of the input/output (I/O) connections. Advances in manufacturing and materials continue to increase the number of transistors that can be positioned on a chip at a rate that approaches the Moore's Law curve. However, the number and size of reliable off-chip connections has nearly reached physical limits. Many prior art approaches have attempted to address this problem.

One approach is to use multiplexed data/address busses. However, with modern microprocessors commonly using 64-bit data and address busses, and some using 128, 256 or more bits, even multiplexing is unable to keep up with the growth in processing power. Furthermore, the increase in processor speed combined with the use of multiple core processors has made even the short time required to multiplex data and addresses onto the same pins a relatively long or slow operation compared to the processing ability of the chip. As such, the I/O has become the rate limiting factor or bottleneck in the system.

As component size decreased, the original ubiquitous DIP package was replaced with miniDIP, and in turn surface-mount technologies like SOP, TSOP, QFP, Pin-Grid Array (PGA), Ball-Grid Array (BGA) and others, all in the attempt to further miniaturize I/O connections and to further increase the information density across the on/off chip interfaces.

In addition to physical packaging constraints, higher frequency signals that are more densely packed present challenges related to electromagnetic interference and cross-coupling of on-chip signals. In particular, as clocking speeds increased, coupling or crosstalk between signals increased, leading to adoption of differential-pair interconnections for transferring high-speed data. While addressing the signal coupling or crosstalk issue, this approach required two I/O connections for each I/O path and therefore did not contribute significantly to increasing I/O capacity.

XAUI, an attachment unit interface standard, and other grouped differential bus standards were created to enable very high speed clocking of the I/O path. However, these standards are also reaching limits as the data transfer speeds approach 40 gigabits-per-second (GBPS) to 100 GBPS. A separate clock (typically 1.25 GHz or a multiple) synchronizes transmitters and receivers at each end of the XAUI bus. Various types of encoding, such as 8b/10b or 64b/66b encoding may be used to aid in synchronization.

As more and more systems begin to incorporate on-the-fly audio and video encoding, it is likely that even combinations of all of the best current approaches will be taxed to keep pace with the ever-increasing bandwidth demands of people, the internet, and the processors that deliver the data.

Various coding strategies have been developed to transmit information over a limited bandwidth channel. One coding strategy used extensively in radio frequency (RF) applications is referred to as Quadrature-Amplitude Modulation (QAM). In this strategy, a sine wave has both its phase and amplitude changed simultaneously to encode information. A QAM diagram has phase and amplitude (or Q and I) axes, with designated "allowable" locations or values (also referred to as stations) for phase/amplitude combinations that define a QAM constellation. The QAM strategy may be referred to by an integer that corresponds to the number of stations in the constellation. As such, a QAM strategy having an arbitrary number "N" of stations in its constellation may be generally referred to as "nQAM".

For example, a typical nQAM with N=16 stations in its constellation (16QAM) may be represented as illustrated in FIG. 1. The vertical axis represents the "Q" (Quadrature or Phase) value of the modulated sine wave while the horizontal axis represents the "I" (In-phase or Amplitude) value. Each station, generally represented by station 20, within the constellation 30 is assigned a value that represents the bits 32 transmitted when that station is visited. In the example illustrated in FIG. 1, each station 20 represents four (4) bits from 0000 to 1111. While a particular pattern of bits 32 may be assigned to any station 20, the stations are typically arranged and numbered using a GRAY code such that only single-bit-changes occur between adjacent stations. For example, station 24 has an associated bit pattern 34 of "0101". Adjacent station 26 has an associated bit pattern 36 of "0100" that differs from bit pattern 34 by a single bit. Similarly, adjacent station 28 has an associated bit pattern 38 of "0001" that differs from bit pattern 34 by a single bit.

Conventional implementations of a QAM coding strategy to transfer data use a base sine wave with one or more devices to provide near-instantaneous modification of the phase and/or amplitude of the sine wave to transition from one constellation station to another. One technique generates phase-locked sine and cosine waves, using the Q value to modulate the amplitude of the cosine wave, and the I value to modulate the amplitude of the sine wave. The two waves are then combined using a mixer to create the transmitted RF output. The channel bandwidth required for transmitting the data is determined by the symbol rate and Nyquist's theorem.

Multiple simultaneous streams of information can be transferred using wideband transmitters/receivers in combination with multiple center-carrier sine waves of different frequencies, separated by at least the bandwidth of each individual information stream.

Recent increases in demand for internet bandwidth-to-the-home have taxed the limits of earlier modulation techniques over the ubiquitous twisted-pair copper wires used for POTS (Plain Old Telephone Service) delivery. The International Telecommunications Union (ITU) has responded to this rapid ramp-up in bandwidth demand by promulgating standards that continue to evolve. Beginning with DSL, the standards that provide additional bandwidth delivery include VDSL (G993.1) and VDSL2 (G993.2). These standards use RF over twisted-pair copper wires in combination with coding techniques such as QAM to create multiple subscriber bands over a single twisted pair.

While such standards are being used to address the bandwidth demands of multi-drop lines from a central office or headend servicing various subscribers, they are overly complex and not currently practical for typical digital systems where most of the information is transferred point-to-point with fan-out handled by dedicated nodes rather than multi-drop lines (e.g. single card, or backplane-interconnected cards, or wire-and-hub networking). At very high speeds, the stubs associated with multiple listeners become difficult to manage, and line reflections, in-coupled noise, and other issues quickly drive high-speed data systems to full-mesh point-to-point designs. Furthermore, attempting to reduce the size of the required encoders, transmitters, receivers, and decoders for VDSL and/or VDSL2 systems so that they could be used as generic chip-to-chip interfaces is beyond problematic.

Digital systems are prone to significant spectral emissions, especially as processor and data rates have continued to increase. To significantly reduce emissions, many modern designs use differential pair signaling and run the differential pairs for XAUIs and other high speed connections on interior layers of a chip or card sandwiched between ground and/or voltage planes to guarantee low radiated emissions from the high speed lines. Radiated emissions are generated in response to switching transients. For example, as a bit on a CMOS integrated circuit changes state from 0 to 1 or from 1 to 0, the nature of the circuit design results in a brief moment when there is a relatively high current flow from power to ground, resulting in a current (and emissions) spike. The switching periods also account for the bulk of the power consumed in CMOS integrated circuits. This is true even for differential pairs, where the two wires are switched to opposite states. During the transition, there are high voltage and current transients in both wires. With perfect switching these transients would be exactly in synch and of opposite sign and would still cancel in the far field. Unfortunately, switching is rarely perfect so switching transients radiate even from well-matched differential pairs.

As such, the present disclosure recognizes a need for increasing the capacity of existing integrated circuit I/O without consuming significant on-chip resources or power budgets, and without a significant increase in radiated emissions.

SUMMARY

In one embodiment, a method for communicating digital data between components connected by first, second, and third conductors includes associating the digital data with corresponding unique two-dimensional coordinates representing amplitude and phase of a periodic waveform having a period of 360 degrees, converting the amplitude and the phase to a first corresponding voltage or current and applying the voltage or current to the first conductor, converting the amplitude and the phase to a second corresponding voltage or current based on a value of the periodic waveform phase shifted by 120 degrees relative to the amplitude and the phase and applying the second corresponding voltage or current to the second conductor, and converting the amplitude and the phase to a third corresponding voltage or current based on a value of the periodic waveform phase shifted by 240 degrees (or equivalently −120 degrees) relative to the amplitude and the phase and applying the third corresponding voltage or current to the third conductor. The method may also include comparing differential voltage or current between pairs of the first, second, and third conductors to a plurality of thresholds to decode the digital data. In various embodiments, the digital data comprises a multiple-bit binary word having "n" bits and the plurality of thresholds is less than $2^n$. Various embodiments may include comparing differential voltage or current between first and second conductors, first and third conductors, and second and third conductors to a plurality of thresholds to generate corresponding binary match patterns having a bit for each threshold, and decoding the digital data based on the asserted bits for the binary match patterns, which may include decoding the digital data based on the minimum and maximum number of asserted bits of the match patterns for a particular symbol period. The digital data may be determined by retrieving stored digital data based on the binary match patterns. In various embodiments, the first, second, and third corresponding voltages or currents sum to substantially zero.

Embodiments according to the present disclosure may also include a system for communicating digital data associated with amplitudes and phases of a periodic waveform having a specified periodicity, such as a period of 360 degrees, between components connected by a plurality of n conductors having circuitry that converts a first amplitude and a first phase to a first corresponding voltage or current and applies the first corresponding voltage or current to a first one of the plurality of conductors, and converts the first amplitude and the first phase to (n−1) corresponding voltages or currents based on amplitudes of the periodic waveform phase shifted by about m*(period/n) relative to the first phase where m is indexed from one to (n−1), and applies each corresponding voltage or current to an associated conductor of the plurality of conductors. In various embodiments, the voltages or currents applied to the plurality of conductors sum to substantially zero. Embodiments may include circuitry that compares voltage or current of each of the plurality of n conductors to a plurality of thresholds and circuitry that selects one of a plurality of predetermined digital data in response to a number of the thresholds exceeded. Embodiments may also include circuitry that generates a differential voltage or current for each unique pair of the plurality of n conductors, where the circuitry that compares voltage or current compares the differential voltage or current to each of the plurality of thresholds.

In other embodiments, a method for integrated circuit chip data transfer includes associating a unique multiple-bit binary pattern with corresponding unique n-dimensional coordinates for each of a plurality of patterns, converting each coordinate of the n-dimensional coordinates to a corresponding voltage or current, and communicating the multiple-bit binary pattern by applying each voltage or current associated with the n-dimensional coordinates to a corresponding conductor of a group of "n" conductors of the integrated circuit chip, where the number "n" of conductors is less than the number of bits of each multiple-bit binary pattern. The method may also include decoding the multiple-bit binary pattern associated with the n-dimensional coordinates based on detecting the voltages or currents of the "n" conductors. In various embodiments, the method includes comparing the voltages or currents to a plurality of thresholds to determine a corresponding coordinate value, and using the n-dimensional coordinates to retrieve an associated unique multiple-bit pattern from a lookup table. The method may also include encoding a stream of coordinates associated with each conductor using a line code (such as 8b/10b encoding) before converting the coordinates to corresponding voltages or currents. Various embodiments of the method may include changing the corresponding conductor associated with a particular dimension of the n-dimensional coordinates to alter DC balance across the group of "n" conductors.

In one embodiment, a method for digital signaling according to the present disclosure includes monitoring a series of sequential coordinate values associated with each conductor, and modifying the coordinate values to adjust at least one of DC balance, radiated emissions, and transition density associated with the series of sequential coordinate values before converting each coordinate to a corresponding voltage or current. Various embodiments of a method according to the present disclosure may include assigning n-dimensional coordinates that maximize distance between adjacent pattern coordinates within an associated voltage or current range of the integrated circuit chip.

In various integrated circuit embodiments, systems or methods according to the present disclosure may include communicating the multiple-bit binary pattern by applying each voltage or current to on-chip conductive traces having substantially matched impedance and extending between integrated circuit components. In some embodiments, the on-chip conductive traces are positioned between conductive layers of the integrated circuit chip that may be ground plane layers, for example.

Other embodiments of systems or methods according to the present disclosure have a number "n" of conductors that corresponds to the number of coordinates in each n-dimensional coordinate. In one embodiment, each n-dimensional coordinate includes "n" components each corresponding to one dimension, and converting includes converting each component to a corresponding voltage or current. In various embodiments, the n-dimensional coordinates are two-dimensional coordinates representing amplitude and phase of a periodic waveform, such as a sinusoid, for example, having a designated period, such as 360 degrees for example, the number "n" of conductors is greater than two, and converting each coordinate includes converting the amplitude and phase to a first voltage or current. The method may also include generating (n−1) voltages or currents each corresponding to values (or amplitudes) of the periodic waveform at phases of about period/n degree intervals where each of the first and (n−1) voltages or currents is applied substantially simultaneously to the corresponding conductor of the group of "n" conductors. In various embodiments, differential voltages or currents for each pair of the conductors are compared to a plurality of thresholds to select the corresponding unique multiple-bit binary pattern. In one embodiment, the number of thresholds is less than the number of permutations of the multiple-bit binary pattern. Embodiments may include generating a binary match pattern for each pair of the conductors with each bit of the binary match pattern associated with one of the plurality of thresholds, and determining the corresponding unique multiple-bit binary pattern based on a maximum and minimum number of asserted bits in the binary match patterns of all of the pairs of the conductors. Embodiments may also include associating the unique multiple-bit binary patterns with n-dimensional coordinates such that adjacent symbols have binary patterns that differ by only one bit.

Various embodiments according to the present disclosure may provide a number of advantages. For example, systems and methods according to the present disclosure facilitate a substantial increase in the input/output capacity of various wired communication/networking applications including integrated circuits, such as microprocessors, without consuming significant on-chip resources or power budgets. Various embodiments according to the present disclosure may provide an order of magnitude or more increase in I/O data rates over chip-to-chip busses without an increase in pin count or significant increases in power budget. As such, embodiments of the present disclosure facilitate a significant increase in chip-to-chip or component-to-component available bandwidth, with an associated significant increase of the processing capability of microprocessors and other integrated circuits. Various embodiments according to the present disclosure transmit multiple bits of information using a single symbol represented by n-dimensional coordinates, which facilitates a reduction in the signal edge rates and a corresponding reduction in radiated emissions. Some embodiments permit only one wire of a group or cluster to change state at a time, which may also reduce radiated emissions. Embodiments may include a ground wire or conductor associated with each signaling cluster of conductors to reduce or eliminate coupling of signals between adjacent signaling clusters.

Embodiments according to the present disclosure address the I/O bottleneck encountered by parallel high-speed systems and provide a path forward that should remove I/O pad size from being the limiting factor for integrated circuit I/O for the foreseeable future. In addition, various embodiments according to the present disclosure provide a general framework for digital signaling over multiple conductors that may reduce power consumption and radiated emissions for high-speed digital data transfer in a wide variety of applications.

BRIEF DESCRIPTION OF THE DRAWINGS

FIGS. 10A-10C illustrate operation of a system or method for decoding data in response to received differential voltages/currents in a tri-phase wired signaling strategy according to various embodiments of the present disclosure;

FIGS. 11A-11C illustrate operation of a system or method for decoding data in response to received differential voltages/currents in a quad-phase wired signaling strategy according to various embodiments of the present disclosure.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
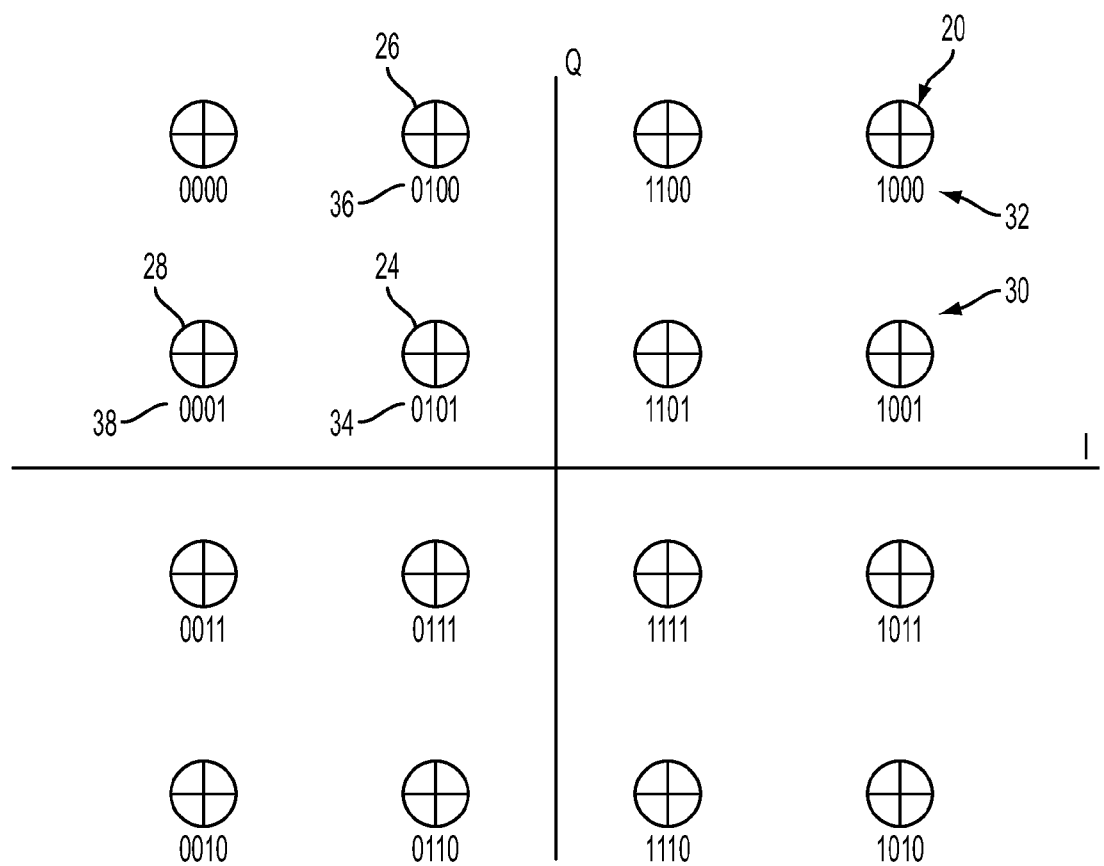
FIG. 1 illustrates a two-dimensional constellation diagram for a 16-symbol embodiment of a system or method according to the present disclosure.

FIG. 1 illustrates a constellation diagram for a 16-symbol embodiment of a system or method for digital signaling that may be used for integrated circuit chip input/output according to the present disclosure. While described above with reference to use in an RF implementation that may be transmitted over a twisted pair, for example, a similar constellation diagram may be used to implement poly-phase or multi-phase wired N-symbol signaling according to various embodiments of the present disclosure. As described in greater detail herein, embodiments according to the present disclosure use n-symbol signaling, such as represented by the 16-symbol constellation 30 of FIG. 1, to code the stations or symbols using voltage/current changes among a group of signaling conductors. For example, a typical N-symbol or N-QAM strategy with N=16 stations or symbols in its constellation may be represented as illustrated in FIG. 1. The stations are arranged within an n-dimensional coordinate system, which is a 2-dimensional coordinate system in this example. While the selected coordinate system and labeling is independent of the invention as described herein, it is useful to explain operation of representative embodiments using the nomenclature and two-dimensional coordinate system of traditional QAM signaling. As described below, particular applications or implementations may select or position the stations/symbols to provide desired system operating characteristics.

As illustrated in FIG. 1, the vertical axis may be thought of as representing the "Q" (Quadrature or Phase) value of a modulated sine wave while the horizontal axis may be thought of as representing the "I" (In-phase or Amplitude) value. Each station, generally represented by station 20, within the constellation 30 is assigned digital data represented by multiple-bit binary pattern 32 that can be considered to be transmitted when the station is visited. As described in greater detail herein, the station or symbol coordinates are communicated between a transmission/encoding device and a receiving/decoding device such that the digital data is recovered from the station/symbol location or coordinates. In the example illustrated in FIG. 1, each station 20 has an associated unique multiple-bit binary pattern 32 with four (4) bits. In a 4-bit strategy, there are $2^4$ or 16 permutations or bit patterns that vary from 0000 to 1111. While a particular pattern of bits 32 may be assigned to any station 20, various advantages with respect to error detection and correction may be obtained if the stations are arranged and numbered using a gray code such that only single-bit-changes occur between adjacent stations. For example, station 24 has an associated bit pattern 34 of "0101". Adjacent station 26 has an associated bit pattern 36 of "0100" that differs from bit pattern 34 by a single bit. Similarly, adjacent station 28 has an associated bit pattern 38 of "0001" that differs from bit pattern 34 by a single bit.

Conventional QAM modulates a base or carrier sine wave using one or more devices to provide near-instantaneous modification of the phase and/or amplitude of the sine wave to transition from one constellation station to another. One technique generates phase-locked sine and cosine waves, using the Q value to modulate the amplitude of the cosine wave, and the I value to modulate the amplitude of the sine wave. The two waves are then combined using a mixer to create the modulated radio frequency (RF) output that is transmitted between sending and receiving stations. The channel bandwidth required for transmitting the data is determined by the symbol rate and Nyquist's theorem.

Transmitting data using conventional N-QAM over conductors arranged as a differential pair in the digital world would require transmitting a differential sine wave signal of sufficiently high frequency that the N-QAM modulation-induced bandwidth remains well above DC. For a 10 gigabit-per-second data rate, using 256-QAM to encode eight bits per symbol, a symbol rate of 1.25 GHz is required, requiring a multi-gigahertz carrier (and inverse) whose phase is precisely controlled. The existing XAUI interfaces achieve this bit rate by using a 64-bit parallel bus clocked at 156.25 MHz. However, transmitting a modulated carrier which contains this information density would require a much higher line frequency. As the current signaling strategies are already approaching physical limits for wire-based frequencies, increasing the base frequency significantly above the current bit rates is not a practical solution.

As recognized by the present disclosure, instead of transmitting a modulated carrier in a differential pair implementation, in various embodiments the Q-axis station coordinate may be represented by the voltage or current on one of the pair of conductors or wires, and the I-axis coordinate may be represented by the voltage or current on the other of the pair to encode a quasi-QAM signal as a pair of voltages or currents on corresponding conductors of the differential pair. In a 16-symbol constellation, each group of four bits may be encoded by voltage/current values representing the coordinates or location of the symbol/station in the constellation, with one dimension represented by the voltage/current on the Q-conductor, and the other dimension represented by the voltage/current on the I-line. Those of ordinary skill in the art will recognize that the voltages or currents can be coupled onto the respective conductors using well-known circuitry/electronics. For example, a voltage-follower design or switchable current-source design may be used to apply the corresponding voltage or current, respectively. A separate clock that identifies symbol intervals may be used to synchronize the devices at each end of the conductors to synchronize transmitters and receivers. This approach of representing the symbol or station location on the Q and I axes from a QAM constellation by a voltage (or current) of a pair of conductors can be generalized or extended to multiple conductors associated with stations arranged within an n-dimensional coordinate system.

For example, the signaling strategy described above can be extended to a three-dimensional N-symbol constellation by adding a third conductor to communicate voltage or current states associated with the third dimension or coordinate component of a particular symbol/station. Similarly, a four-dimensional system or method can be used with four conductors each assigned to one dimension of the coordinates, and so on. In a four-wire system with only four voltage or current states per wire, this strategy can transmit one eight-bit symbol per transition, using only four conductors as compared to the 16 conductors required by an eight-bit XAUI interface.

As recognized by the present disclosure, this signaling strategy raises potential issues with respect to practical implementations, such as generating precision voltages or currents to represent the different stations and corresponding locations/coordinates within the constellation. Likewise, similar to traditional differential pair signaling strategies that use capacitive coupling to apply the signals to the conductors, continuous transmission of a single bit value could saturate the coupling capacitors at either end of the pair. As such, encoding methods such as 8b/10b or similar line coding techniques with embedded commands may be used to allow bit randomization/inversion to avoid these conditions. Furthermore, differential pairs are used in many conventional strategies because the EM fields from the pair self-cancel in the far field if impedance is correctly controlled and wire lengths match closely. While the signaling strategy described above does not utilize a traditional differential pair, the radiated emissions may be managed and may be acceptable for many applications as described below.

Precision Voltages

As long as the stations in the constellation represent voltages which are offset by easily-generated gaps (e.g. on the order of a diode-drop), those of ordinary skill in the art may recognize that generating precision voltage/current references on both transmit and receive devices is fairly straight-forward. While thermal gradients between transmit and receive devices may impact the matching from device to device, protocols analogous to line coding protocols such as 8b/10b, 64b/66b, or Transition Minimized Differential Signaling (TMDS), for example, can be used to send packets of data which exercise the full range on the transmitter so the receiver can perform local calibration and adjust to drift across time/temperature.

If stations represent currents rather than voltages, precision current sources can be provided that are summed through a precision Norton-style amplifier to create the pin or conductor current. Analogous encoding methods can be used for data transport and similar calibration and drift compensation can be done in a current-based design.

Driver design has already been briefly described. In one implementation, a bank of precision voltages is generated, and a low-impedance-output, high-impedance-input voltage-follower is switched via pass-gates from one voltage to another by a decoder fed by the bits which control that particular pin/conductor from the set of bits associated with the currently transmitting symbol. The follower is designed to generate an edge compliant with design specifications that may vary by application or implementation.

Capacitor Saturation

In XAUIs and similar capacitive-coupled data transfer systems, encoding strategies such as 8b/10b or 64b/66b are used for the data to control DC balance, emissions, transition density, etc. To provide desired DC balance, a given wire should transition from one sign to the opposite sign regularly, similar to a differential pair design. However, in contrast to the XAUI and similar implementations, in systems and methods for digital signaling according to various embodiments of the present disclosure, the capacitors are no longer switching between fully charged and discharged states. Rather, the capacitors are switching between rates of charging and discharging. A similar encoding system can readily be used in various embodiments according to the present disclosure that monitor the transmitted bit stream and shuffle bit order, bit encoding, etc., to maintain DC balance, emissions, effective transition density, etc., analogous to the 8b/10b, 64b/66b, and other line coding or encoding systems familiar to those of ordinary skill in the art.

In one embodiment, DC balance across the conductors within a particular signaling group is managed by changing the corresponding conductor associated with a particular dimension of the n-dimensional coordinates. For example, in a 4-wire (4-dimensional) implementation with each station/symbol having coordinates associated with a 4-dimensional coordinate or 4-tuple vector such as <a,b,c,d>, the dimension or component (such as "a") communicated by a particular conductor $c_1$ can be periodically changed (switched to one of the "b", "c", or "d" components) to manage DC balance across all wires.

Emissions

Digital systems are prone to significant spectral radiated emissions, especially as processor and data rates have continued to increase. To reduce emissions, many modern designs run differential pairs for XAUI and other high speed connections on interior layers of a card or circuit board, with ground and/or voltage planes above and below the pairs to reduce radiated emissions from the integrated circuit chip. This technique can be used with the signaling strategies according to various embodiments of the present disclosure as well to manage emissions by placing the signaling conductors between conductive ground or voltage planes of the integrated circuit chip or system card/circuit board.

Emissions are also related to the edge speeds of the transmitted signals. The signaling strategy according to various embodiments of the present disclosure permits transmission of multiple bits per symbol, i.e. voltage change on one or more wires. As such, the signaling strategy of various embodiments according to the present disclosure facilitates reduced symbol rates and associated reduction in edge rates and radiated emissions. Those of ordinary skill in the art will recognize that drivers have already been designed to drive specified loads with guaranteed edge rates. As such, the voltage-follower approach described above as a representative driver implementation for a signaling strategy as described herein is a straight-forward modification of existing designs.

Radiated emissions can also be managed by limiting or restricting voltage/current transitions to one conductor at a time within a cluster of signaling conductors, i.e. adjacent symbol coordinates vary by only a single dimension. Embodiments that operate with such a constraint may have advantages with respect to error detection and correction and/or better noise immunity. For example, embodiments that use this strategy have the advantage on the receiver side of being able to assume that any voltage/current change in the stable or unchanging conductor(s) maps to a common-mode change in the conductor that is anticipated to change voltage/current levels. This is generally a valid assumption as most transients common-mode couple onto adjacent conductors. In a 256-symbol system, this means that a symbol-change effectively transmits only four bits of information because from any given station, the next symbol must be adjacent, i.e. the subsequent symbol can only be a side-to-side or up-and-down station movement depending on which conductor is scheduled to move during the current symbol window or time interval.

Finally, in the layout of the signaling conductors, a ground conductor can be incorporated into each symbol-carrying conductor cluster. This will reduce or prevent coupling of signals from the outside conductor(s) of a cluster to the outside conductor(s) of an adjacent cluster.

As those of ordinary skill in the art may recognize, managing radiated emissions may be the most difficult challenge for the signaling method described above that assigns and uses a conductor for each coordinate of the symbol in a particular signaling constellation because there is no longer a true differential pair whose EM emissions cancel in the far field. For lower data rates, however, this strategy may be sufficient for a number of applications and offers enormous potential for bandwidth gain across existing I/O boundaries with low circuit-area impact on the transmit/receive sides of the boundary. Differential signaling could also be employed without loss of generality where each differential pair transmits a positive and a negative signal value for the given symbol coordinate dimension. While this would double the number of conductors needed relative to a single conductor per dimension, the bandwidth increase by using the non-binary encoding still reduces the total number of conductors relative to various prior art implementations.

Those of ordinary skill in the art will recognize that the standard oscilloscope-based "eye diagram" for determining signal quality is no longer available as an analysis tool for signaling strategies according to various embodiments of the present disclosure. Rather, a plot of the constellation points or symbol coordinates over a long dwell with every constellation point visited may be used to determine the system fidelity. Systems with high fidelity will exhibit a smaller variance around the ideal symbol coordinates whereas lower fidelity will result in a constellation diagram having broad/blurry/smeared symbol points or stations.

Multi-Phase Wired n-Symbol Signaling

As recognized by the present disclosure, switching transients are a significant source of radiated emissions from digital equipment. As a bit on a CMOS integrated circuit changes state from 0 to 1 or from 1 to 0, the nature of the design has a brief moment when there is a relatively high current path from power to ground, resulting in a current spike and associated emissions. This occurs even on differential pairs, where the two conductors are substantially simultaneously switched to opposite states. During the transition, there are high voltage and current transients in both conductors. With ideal switching, these transients would be exactly synchronized and have opposite sign/sense such that they would cancel in the far field. In actual implementations, however, switching is rarely perfect and the switching transients result in radiated emissions, even from well-matched differential pairs.

As also recognized by the present disclosure, power generation companies have long used three-phase conductors for long-distance power transmission, with each conductor carrying a voltage or current that is 120° phase advanced or retarded relative to an adjacent conductor. For a three-wire/conductor cluster, relative phasing of 0°, 120°, and 240°, or alternately, 0°, 120°, and −120° may be used. Analysis of this power transmission strategy reveals that power per unit time is constant as long as demand on each conductor is identical.

The present disclosure also recognizes that the bulk of the power consumed in CMOS integrated circuits implementing traditional signaling strategies is associated with switching between states. The voltage across the CMOS device remains fairly constant (with good capacitive decoupling), but very large current transients occur at every gate that changes binary state.

As such, the ability to use wired n-symbol signaling with more than two conductors may be used to advantage in various embodiments according to the present disclosure to create a system having the capability to transmit data from one device to another device using near constant power and near zero radiated emissions. With careful design, switching transients associated with transitions from one transmitted symbol to another, and power fluctuations on either the transmitter or the receiver can be reduced or eliminated. While currently suitable for a wide variety of I/O applications, including integrated circuit chip and microprocessor I/O, the polyphase signaling strategy of various embodiments of the present disclosure may also be used internally within an integrated circuit chip as die-shrink continues to enable miniaturization of more complex devices. In addition, appropriate selection and design of transmitter/receiver drivers may also facilitate lower total power consumption relative to existing I/O signaling strategies.

Figure 2:
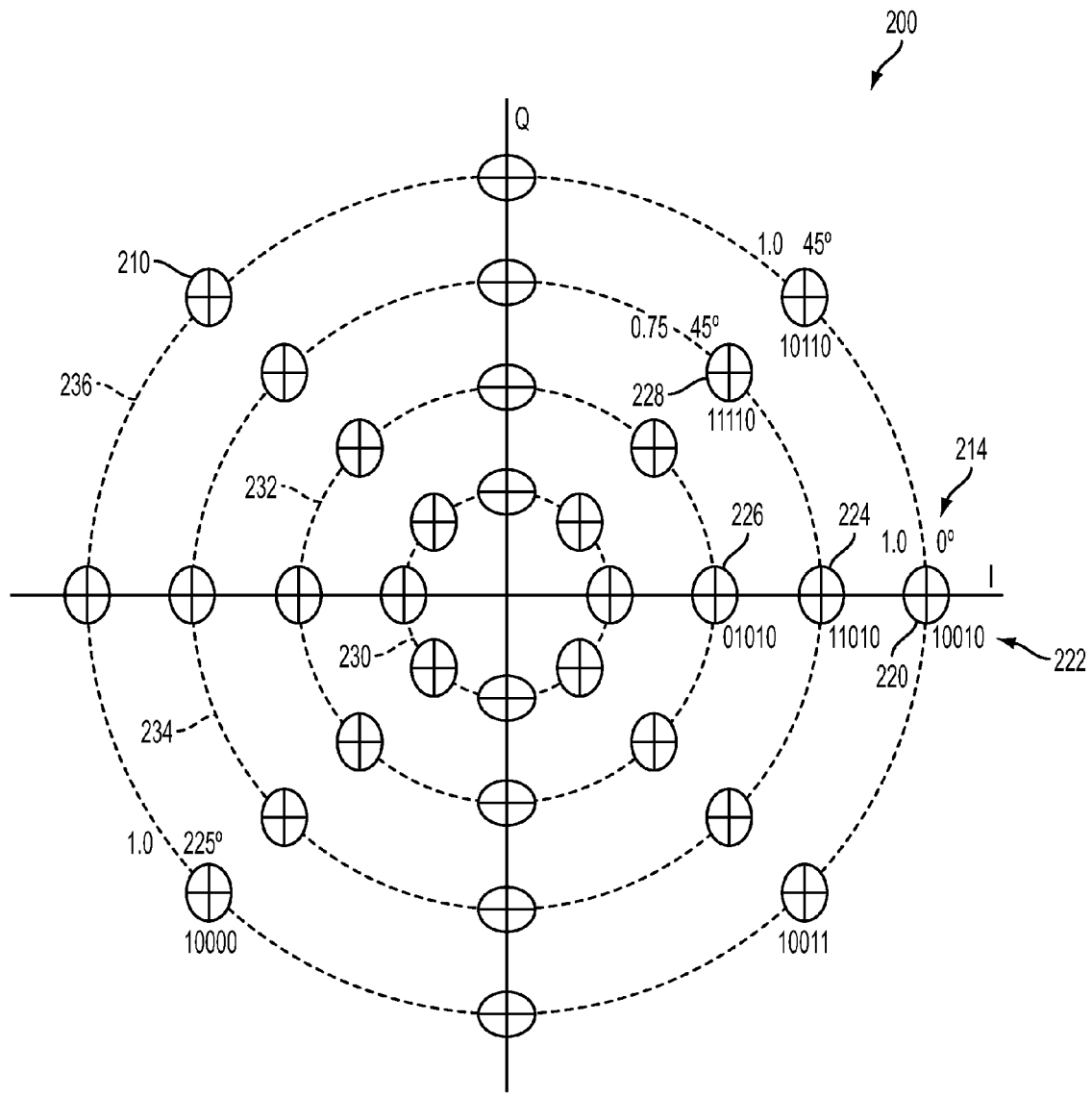
FIG. 2 illustrates a two-dimensional constellation diagram for a 32-symbol embodiment of a system or method according to the present disclosure.

FIG. 2 illustrates a two-dimensional constellation diagram 200 for a 32-symbol embodiment of a system or method according to the present disclosure. The two-dimensional coordinate system illustrated in FIG. 2 continues to use QAM nomenclature without loss of generality. Constellation diagram 200 includes 32 symbols or stations 210. In the representative embodiments described below, the symbol or station coordinates can be represented by an I-axis coordinate that may also represent amplitude of a periodic (virtual) waveform used to encode or determine transmitted voltage/current values, analogous to a QAM signal if the data were being transmitted via a modulated RF sine wave. Those of ordinary skill in the art will recognize that the periodic waveform having a period of 360° is used only to determine values for the polyphase signaling strategy and that the waveform is not a physical signal. Rather, the values determined using the periodic waveform may be stored in a look-up table, or may be hard-coded or firm-coded in a gate array and/or by corresponding selection of component values used in the transmit/receive driver circuitry. Because the periodic waveform is used only to determine the signaling voltage/current values for each conductor within a signaling cluster of conductors and is not actually transmitted as a signal on any of the conductors, the periodic waveform is referred to as a virtual waveform. In the embodiment illustrated in FIGS. 2-4, a sinusoidal waveform is used and referred to as a virtual sine wave ("VSW"). Similarly, without loss of generality and continuing the use of QAM nomenclature, the other coordinate axis may be designated the Q-axis and may be thought of as analogous to the phase that the VSW would have if it were actually transmitted in a conventional RF QAM strategy.

As previously described and illustrated in the constellation diagram 200 of FIG. 2, each symbol or station 210 has associated n-dimensional coordinates 214 that may be represented by an I-component and a Q-component in a rectilinear coordinate system, for example. Alternatively, the location or coordinates of each symbol may be expressed as an n-tuple vector having a magnitude (or amplitude) and phase angle. For example, symbol 220 may be identified by an n-tuple <1.0,0> having a first component "1.0" representing an amplitude, and a second component "0" representing a phase or phase angle. The amplitude and phase (or other coordinate representation) may be used to specify a first voltage/current value corresponding to a point on the periodic waveform, or VSW in this example, that is then used to determine or generate additional voltages/currents based on phase shifted values of the period waveform for each of the conductors within the signaling cluster as described in greater detail below.

As with the constellation diagram of FIG. 1, each station or symbol 210 in the constellation diagram 200 of FIG. 2 includes associated digital data, represented by a unique multiple-bit binary pattern 222, that is communicated to, and decoded by, the receiver via detection of the associated symbol coordinates. In the representative constellation diagram 200, the 32 symbols 210 are arranged generally symmetrically and spaced at 45 degree intervals with unique multiple-bit binary patterns 222 assigned using a gray code such that only a single bit changes between two adjacent symbols. For example, binary pattern 224 (11010) differs by only a single bit relative to binary pattern 220 (10010), binary pattern 226 (01010), and binary pattern 228 (11110), etc. In this example, symbols 210 are arranged around circles 230, 232, 234, 236 having radial values or amplitudes of 0.25, 0.50, 0.75, and 1.0, respectively. Those of ordinary skill in the art will recognize that the symbol/station locations may be assigned to achieve desired system performance and that the signaling strategy is generally independent of the particular location assignment and associated digital data/binary pattern. Similarly, although the constellation diagrams illustrated in FIGS. 1 and 2 have generally symmetrically, regularly spaced stations, an asymmetric configuration may be used depending on the particular application and implementation.

Figure 3:
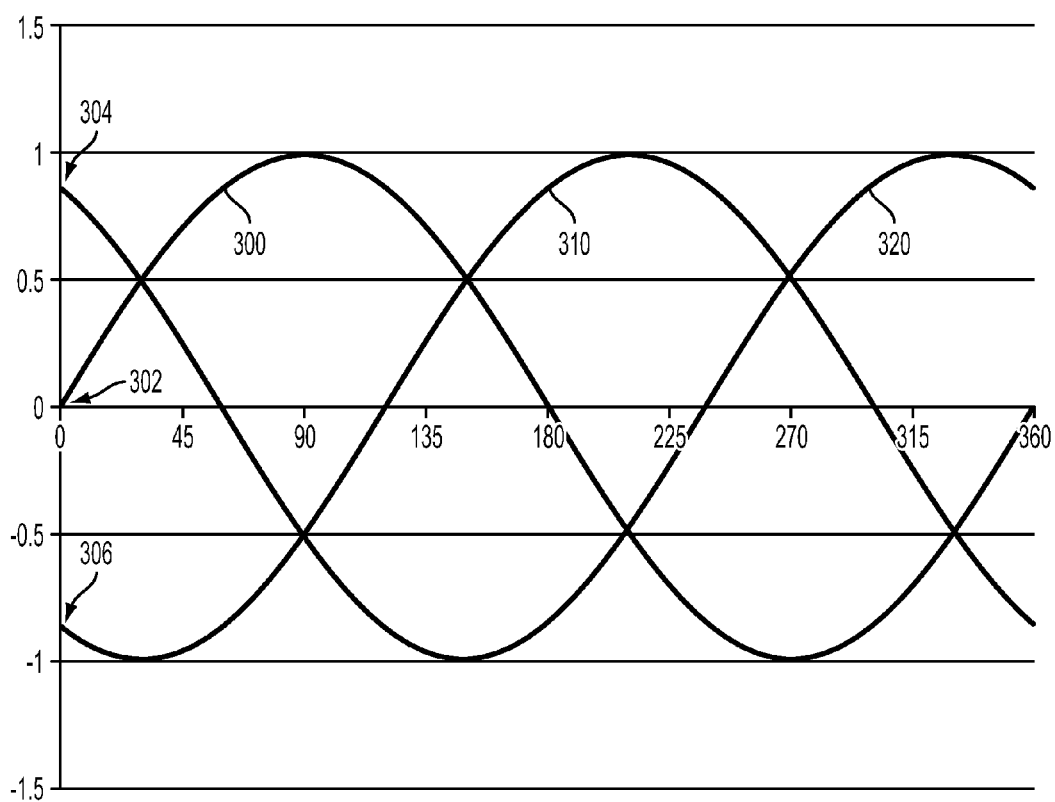
FIG. 3 illustrates a representative virtual periodic waveform having a designated period of 360 degrees in addition to phase-shifted versions of the waveform for use in generating voltages or currents representing digital data in various embodiments of a system or method according to the present disclosure.

FIG. 3 illustrates a representative virtual periodic waveform having a designated period of 360 degrees in this example, in addition to phase-shifted versions of the waveform for use in generating voltages or currents representing digital data in various embodiments of a system or method according to the present disclosure. In the representative embodiment illustrated in FIG. 3, periodic waveform 300 represents a VSW having an amplitude of 1.0. Waveforms 310, 320 are shown to illustrate the same waveform 300 phase shifted by 120° and 240° (or equivalently −120°), respectively. Those of ordinary skill in the art will recognize that the VSW may have a different designated period, or may be implemented by a periodic waveform other than a sine wave depending on the particular application and implementation.

Figure 4:
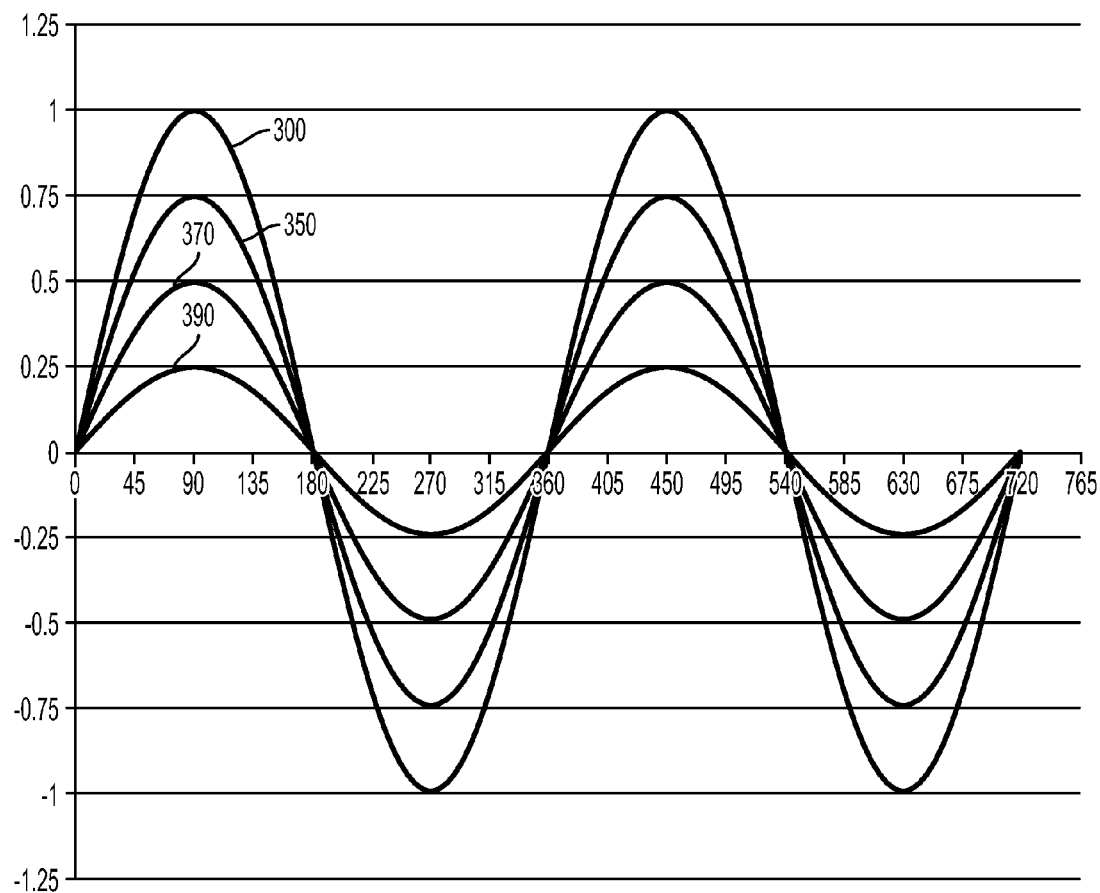
FIG. 4 illustrates representative virtual periodic waveforms having a designated period of 360 degrees and different amplitudes for use in generating voltages or currents representing digital data in various embodiments of a system or method according to the present disclosure.

FIG. 4 illustrates representative virtual periodic waveforms each having a period of 360 degrees and different amplitudes for use in generating voltages or currents representing digital data in various embodiments of a system or method according to the present disclosure. Waveform 300 corresponds to the VSW of FIG. 3 with an amplitude of 1.0. Waveforms 350, 370, and 390 have the same period and phase, but amplitudes of 0.75, 0.50, and 0.25, respectively. Waveforms 300, 350, 370, and 390 may be used to illustrate determination of voltage/current values used to encode station coordinates of a constellation diagram, such as the constellation diagram of FIG. 1, or the constellation diagram 200 of FIG. 2, for example.

Figure 5A:
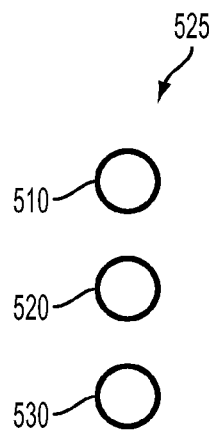
FIGS. 5A-5D illustrate representative arrangements for three-conductor signaling clusters for I/O signaling using multi-phase wired signaling according to various embodiments of the present disclosure.
Figure 5B:
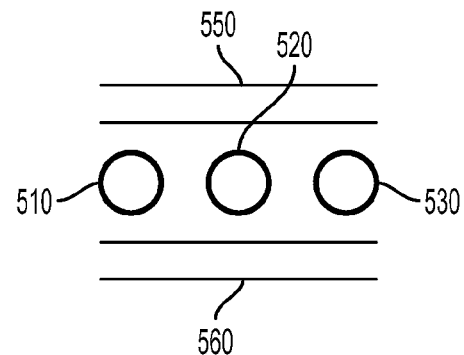
Figure 5C:
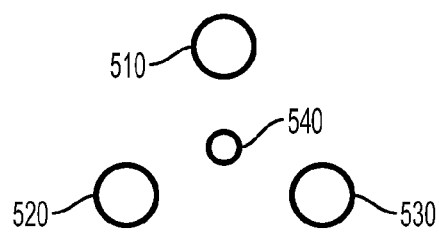
Figure 5D:
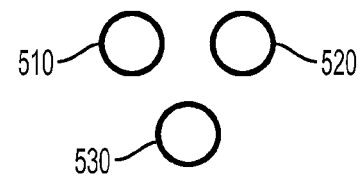

FIGS. 5A-5D illustrate representative arrangements for three-conductor signaling clusters 525 for I/O signaling using multi-phase wired signaling according to various embodiments of the present disclosure. FIG. 5A illustrates a representative embodiment having a signaling cluster 525 with three conductors 510, 520, and 530 in a generally vertical arrangement. Conductors 510, 520, and 530 may be implemented by single or multi-stranded insulated wires, or may be implemented as conductive traces on a circuit board or within an integrated circuit, for example. FIG. 5B illustrates conductors 510, 520, and 530 in a generally planar arrangement positioned between generally parallel planes 550 and 560 of an integrated circuit chip or circuit board layers, for example. As previously described, one or more signaling clusters 525 may be positioned between conductive planes or layers 550, 560 that may be implemented as a voltage plane of generally constant potential, or ground plane, to reduce or eliminate radiated emissions. FIG. 5C illustrates an alternative arrangement of conductors 510, 520, and 530 with a ground conductor 540. FIG. 5D illustrates a similar arrangement of conductors 510, 520, and 530 without a ground wire or conductor. Those of ordinary skill in the art will recognize that the shape, size, and number of conductors may vary depending on the particular application and implementation to provide desired system characteristics. Wires or other conductors may be insulated or otherwise separated from one another and may be generally parallel, or may be twisted with a specified twist ratio. Various embodiments according to the present disclosure use impedance matched conductors to provide desired operating characteristics as described in greater detail herein.

Operation of a representative embodiment of a multi-phase wired signaling strategy having three conductors, such as conductors 510, 520, and 530, is described with reference to FIGS. 2-5. One of the conductors, such as conductor 510 is arbitrarily designated as a base/reference conductor denoted "Q" and is used to transmit voltage/current values generated/determined using a periodic waveform, such as a VSW. In the embodiments illustrated, the "Q" conductor has voltage/current values corresponding to a 0° phase shifted VSW, such as VSW 300. One of the remaining conductors 520 is arbitrarily designated as "R" for purposes of this example, representing the same virtual sine wave 300, but at a location determined by the period/n, where the period is 360°/3 or 120° phase shifted along the wave, which can also be represented by phase shifted VSW 310. The remaining conductor 530 is designated as "S", representing the same virtual sine wave 300, but at a location 240° phase shifted along the waveform, which can also be represented by phase-shifted waveform 320, for example. For printed circuit board (PCB) layouts, the three conductors can be oriented as planar, vertical, or triangle cross-sections, with typical arrangements illustrated in FIGS. 5A-D and described above. Similar to differential pair implementations, controlled impedance and impedance matching across conductors of a signaling cluster is desired to manage radiated emissions, power, and other performance characteristics.

In translating or encoding the constellation stations or coordinates as illustrated in FIG. 2, for example, to voltage/current values to apply to the designated QRS conductors 510, 520, and 530, respectively, a table like the one below may be used. The table values may ultimately be represented or implemented by an appropriate selection of circuit component values and arrangement in the transmit/receive driver circuitry. The table below illustrates representative QRS voltage coding for a voltage-based tri-phase (three conductor) signaling strategy (system or method) with 32 stations or symbols. For each station, the driver circuitry applies voltages associated with the two-dimensional (in this example) coordinates to corresponding QRS conductors in the group or cluster of three conductors representing values of the VSW at appropriate phase offsets. For example, the Q conductor directly encodes the VSW amplitude/phase as a current or voltage value associated with the selected station/symbol in the constellation. The R conductor encodes the VSW amplitude/phase for a position that is phase shifted (advanced or retarded) by 120°. The S conductor encodes the VSW amplitude/phase for a position phase shifted by 120° relative to the Q and R conductors, i.e. retarded by −120° or advanced by 240°.

In operation, each symbol/station 220 includes associated digital data, represented by multiple-bit binary pattern 222, and an assigned two-dimensional coordinate/location <1,0> representing amplitude (1.0) and phase (0°) of a periodic waveform 300 having a period of 360 degrees in this embodiment. As shown in the lookup table below and in FIGS. 3 and 4, the amplitude and phase is converted to a first corresponding voltage (or current) based on the value of the periodic waveform as represented by point 350 and applied to a first conductor 510 (Q). The amplitude and phase is converted to a second corresponding voltage (or current) based on a value of the periodic waveform 300 phase shifted by 120 degrees as represented in the table below and by point 360 of FIG. 3. This voltage (0.866025) is applied to the second conductor 520 (R) by the driver circuitry. The amplitude and phase is converted to a third corresponding voltage (or current) based on a value of the periodic waveform 300 phase shifted by 240 degrees as represented in the table below and by point 370 of FIG. 3. This voltage (−0.866025) is applied to the third conductor 530 (S) by the driver circuitry. As those of ordinary skill in the art will appreciate, the voltages (or currents) are applied to the QRS conductors at substantially the same time, i.e. within a symbol window, as determined to provide appropriate margin for a synchronization clock signal provided to the transmit/receive driver circuitry as previously described.

having an amplitude of 0.25. The QRS values for any amplitude/phase station coordinate/location may be obtained as previously described and illustrated with respect to FIG. 3. As indicated in the table below, the voltages (or currents) associated with each symbol sum to substantially zero.

| Symbol Coordinates | | Data Pattern | Conductor Designation and Value (voltage/current) | | | Differential Values (voltage/current) | | |
|---|---|---|---|---|---|---|---|---|
| Amp | Phase | Bits | Q | R (+120) | S (+240) | Q–R (QR) | S–Q (SQ) | R–S (RS) |
| 0.25 | 0 | 00010 | 0 | 0.216506 | −0.21651 | −0.21651 | −0.21651 | 0.433013 |
| 0.25 | 45 | 00110 | 0.176777 | 0.064705 | −0.24148 | 0.112072 | −0.41826 | 0.306186 |
| 0.25 | 90 | 00111 | 0.25 | −0.125 | −0.125 | 0.375 | −0.375 | 0 |
| 0.25 | 135 | 00101 | 0.176777 | −0.24148 | 0.064705 | 0.418258 | −0.112072 | −0.30619 |
| 0.25 | 180 | 00100 | 0 | −0.21651 | 0.216506 | 0.216506 | 0.21651 | −0.43301 |
| 0.25 | 225 | 00000 | −0.17678 | −0.0647 | 0.241481 | −0.11207 | 0.41826 | −0.30619 |
| 0.25 | 270 | 00001 | −0.25 | 0.125 | 0.125 | −0.375 | 0.375 | 0 |
| 0.25 | 315 | 00011 | −0.17678 | 0.241481 | −0.0647 | −0.41826 | 0.11207 | 0.306186 |
| 0.5 | 0 | 01010 | 0 | 0.433013 | −0.43301 | −0.43301 | −0.433013 | 0.866025 |
| 0.5 | 45 | 01110 | 0.353553 | 0.12941 | −0.48296 | 0.224144 | −0.836516 | 0.612372 |
| 0.5 | 90 | 01111 | 0.5 | −0.25 | −0.25 | 0.75 | −0.75 | 0 |
| 0.5 | 135 | 01101 | 0.353553 | −0.48296 | 0.12941 | 0.836516 | −0.224144 | −0.61237 |
| 0.5 | 180 | 01100 | 0 | −0.43301 | 0.433013 | 0.433013 | 0.43301 | −0.86603 |
| 0.5 | 225 | 01000 | −0.35355 | −0.12941 | 0.482963 | −0.22414 | 0.83652 | −0.61237 |
| 0.5 | 270 | 01001 | −0.5 | 0.25 | 0.25 | −0.75 | 0.75 | 0 |
| 0.5 | 315 | 01011 | −0.35355 | 0.482963 | −0.12941 | −0.83652 | 0.22414 | 0.612372 |
| 0.75 | 0 | 11010 | 0 | 0.649519 | −0.64952 | −0.64952 | −0.649519 | 1.299038 |
| 0.75 | 45 | 11110 | 0.53033 | 0.194114 | −0.72444 | 0.336216 | −1.254774 | 0.918559 |
| 0.75 | 90 | 11111 | 0.75 | −0.375 | −0.375 | 1.125 | −1.125 | 0 |
| 0.75 | 135 | 11101 | 0.53033 | −0.72444 | 0.194114 | 1.254774 | −0.336216 | −0.91856 |
| 0.75 | 180 | 11100 | 0 | −0.64952 | 0.649519 | 0.649519 | 0.64952 | −1.29904 |
| 0.75 | 225 | 11000 | −0.53033 | −0.19411 | 0.724444 | −0.33622 | 1.25477 | −0.91856 |
| 0.75 | 270 | 11001 | −0.75 | 0.375 | 0.375 | −1.125 | 1.125 | 0 |
| 0.75 | 315 | 11011 | −0.53033 | 0.724444 | −0.19411 | −1.25477 | 0.33622 | 0.918559 |
| 1 | 0 | 10010 | 0 | 0.866025 | −0.86603 | −0.86603 | −0.866025 | 1.732051 |
| 1 | 45 | 10110 | 0.707107 | 0.258819 | −0.96593 | 0.448288 | −1.673033 | 1.224745 |
| 1 | 90 | 10111 | 1 | −0.5 | −0.5 | 1.5 | −1.5 | 0 |
| 1 | 135 | 10101 | 0.707107 | −0.96593 | 0.258819 | 1.673033 | −0.448288 | −1.22474 |
| 1 | 180 | 11101 | 0 | −0.86603 | 0.866025 | 0.866025 | 0.86603 | −1.73205 |
| 1 | 225 | 10000 | −0.70711 | −0.25882 | 0.965926 | −0.44829 | 1.67303 | −1.22474 |
| 1 | 270 | 10001 | −1 | 0.5 | 0.5 | −1.5 | 1.5 | 0 |
| 1 | 315 | 10011 | −0.70711 | 0.965926 | −0.25882 | −1.67303 | 0.44829 | 1.224745 |

QRS values for a tri-phase wired 32-symbol constellation as shown in FIG. 2 are represented by the periodic waveforms illustrated in FIG. 4 and listed in the lookup table below. As previously described, the constellation station locations/coordinates may be assigned to achieve particular performance characteristics. However, in this representative embodiment using the constellation diagram 200 of FIG. 2, stations are symmetrically spaced at four substantially equal intervals of +0.25, +0.50, +0.75, and +1.0. This arrangement facilitates scaling to other voltage/current ranges appropriate for a particular PCB, IC, or other wired application based on the associated board/chip/system voltage. The stations/symbols are substantially equally spaced around the 360° circle, at 45° intervals in this example, although other arrangements are possibly and within the scope of the invention. This representative arrangement provides eight "radials" and four positions on each radial for a total of 32 stations/symbols in the constellation, for a five-bit coding system using three conductors between transmitting and receiving components. Those of ordinary skill in the art will appreciate that if negative amplitudes are used, the phase coordinates should be selected such that a negative amplitude does not map onto another phase radial that is 180 degrees from the current one. The QRS values listed in the table below are generally illustrated by the periodic waveforms of FIG. 4 with waveform 300 having an amplitude of 1.0, waveform 350 having an amplitude of 0.75, waveform 370 having an amplitude of 0.5, and waveform 390 having an amplitude of 0.25.

As previously described, the phase arrangement for any given constellation can be arranged to provide desired separation and associated detectability for a particular application or implementation. Those of ordinary skill in the art may recognize that the multi-phase signaling strategy described above may facilitate auto-alignment of voltages between transmitters and receivers. For example, if a transmitter were sending to a receiver where only the ground is shared, the receiver could auto-align by determining the absolute min/max voltages on the Q wire and using those to scale the R & S wires to recover the constellation. In addition, because the signaling strategy is modeled after the ubiquitous tri-phase power transmission system, the steady-state power at every station is nearly identical for a particular amplitude if the design has controlled impedance.

The multi-phase signaling strategy according to various embodiments of the present disclosure provides a number of advantages. For example, while a transition from one station/symbol to another station may produce little or no voltage/current change in one wire of the signaling cluster, one or more of the other wires experiences a larger-range digital-like voltage swing, which improves noise margin and reduces bit error rate. In addition, external transients tend to couple equally onto all wires of a signaling cluster, which still permits decoding a station and associated digital data based on the relative values between the various wires rather than absolute individual values. Using the differential voltage/current values between pairs of conductors within a signaling cluster also provides common-mode noise rejection while still providing a good set of detection values as demonstrated by the examples below. Furthermore, because the positions/locations/coordinates of the stations in the constellation are arbitrary, they may be positioned to achieve specified voltage/current ratios that are easier to generate and decode, rather than using forced equal spacing. In addition, the nearly identical power-per-station for a given amplitude, indicates that the signaling strategy may be able to achieve constant power during transitions, achieving a digital transmission system with near zero switching emissions.

Those of ordinary skill in the art will appreciate that traditional system analysis tools, such as the "eye diagram" associated with differential pairs is no longer directly available. Furthermore, many possible encodings exist where no station/symbol has the full amplitude value. However, as long as the QRS stream visits each station with substantially the same probability, recovery of the constellation and the associated digital data is possible even with severe signal drop down a transmission line, similar to the manner used in conventional RF N-QAM systems.

Transmission-Side Implementation for Multi-Phase Wired Signaling

Figure 6:
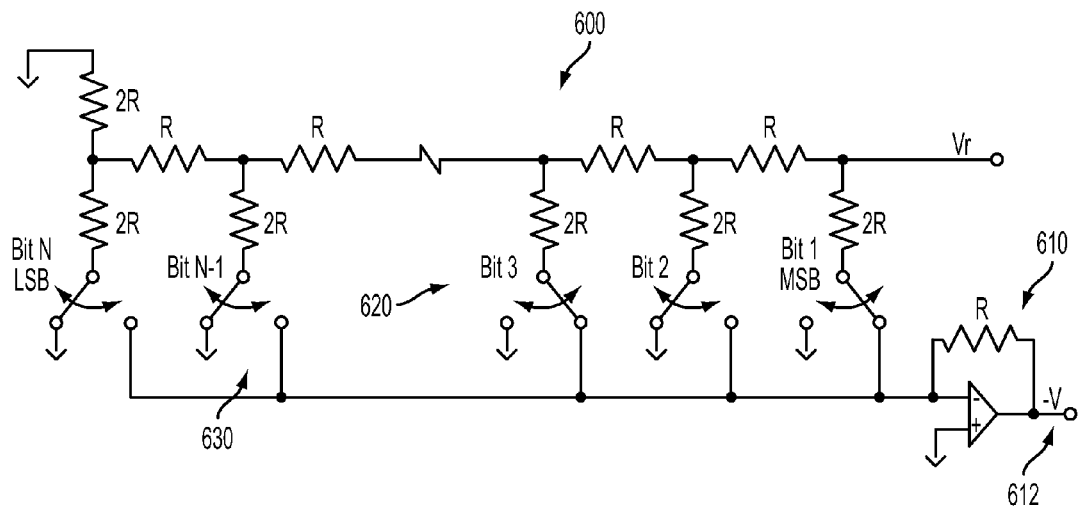
FIG. 6 is a diagram illustrating a representative embodiment of a transmission device including circuitry for multi-phase wired signaling according to the present disclosure.

FIG. 6 is a diagram illustrating a representative embodiment of circuitry for a transmission device for use in multi-phase wired signaling according to the present disclosure. Circuitry 600 implements a standard R-2R constant-current switch ladder to generate a corresponding voltage which is applied to one of the signaling conductors through a precision voltage follower/inverter. In the representative embodiment of a transmission device illustrated in FIG. 6, $V_r$ is connected to an internal reference voltage, and the voltage follower/inverter 610 directly drives the associated conductor 612 by applying the corresponding voltage to the conductor. A look-up table or similar device drives the switching bits 620 to select the voltage appropriate for the QRS wire being driven as previously described. One advantage of an R-2R ladder as illustrated in FIG. 6 is that the various switches 630 controlled by bits 620 can be implemented as make-before-break switches (e.g. MAX4625 analog switches available in 6-pin packages from Maxim, Sunnyvale, Calif.) which allows constant current flow without switching transients at the driving side.

Those of ordinary skill in the art will recognize that the switching bits 620 are selected to generate a suitable number of voltages as required by the number of symbols and the constellation coordinate assignments. For example, if using the table above in a 32-symbol system, Vr would be connected to +1, and the number of switching bits 620 would be selected to give reasonable approximations of the different Q, R, and S values from the table. As previously, described, the representative embodiment illustrated facilitates scaling to various system voltages.

Figure 7:
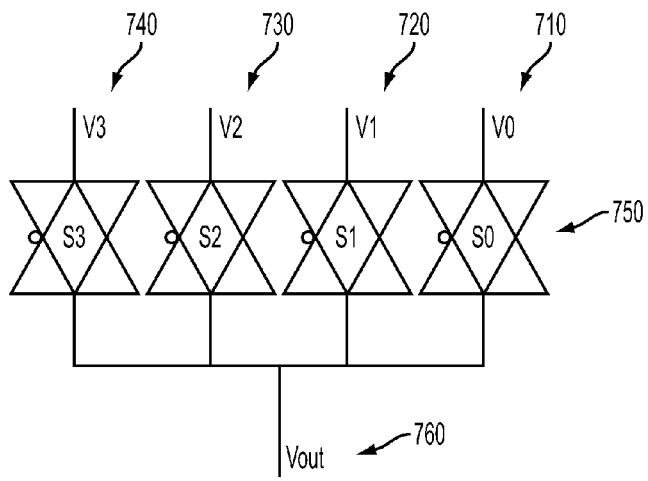
FIG. 7 illustrates another representative embodiment of a transmission device using CMOS transmission gates for multi-phase wired signaling according to the present disclosure.

FIG. 7 illustrates another representative embodiment of circuitry for a transmission device using CMOS transmission gates for multi-phase wired signaling according to the present disclosure. In the embodiment illustrated in FIG. 7, fixed voltage sources 710, 720, 730, and 740 are selectively switched by CMOS transmission gates 750 to select the appropriate voltage source and apply the corresponding voltage to conductor 760. As such, voltages represented by V0 . . . V3 (readily extended to an arbitrary number of voltages) corresponding to the Q, R, or S values previously described are connected to a respective CMOS transmission gate S0 . . . S3. The desired voltage may be selected by using a decoder to select one specific transmission gate to enable. A design such as this one would internally generate a voltage reference tree that contains all of the required voltages in the Q, R, and S columns in the table above.

The representative implementations of FIG. 6 and FIG. 7 permit reasonable accuracy in generating a corresponding voltage, $V_{out}$, for driving each of the Q, R, and S conductors. Of course, those of ordinary skill in the art may recognize various other implementations to apply a selected voltage to the conductors in a signaling cluster consistent with the present disclosure.

In operation, the circuitry illustrated in the embodiments of either FIG. 6 or FIG. 7 may be used to convert a first amplitude and phase of a periodic waveform to a first corresponding voltage and apply the first corresponding voltage to a first at least one of the plurality of conductors in a signaling cluster. Similarly circuitry may be used to drive each of the "n" conductors in a signaling cluster such that each stage or section is associated with a particular conductor and operates to convert the first amplitude and first phase to a corresponding voltage based on the amplitude of the periodic waveform phase shifted by m*period/n degrees relative to the first phase, where m is indexed from one to (n−1).

As previously described, each conductor in the group of conductors of a signaling cluster may be implemented by two conductors of a differential pair. As such, a voltage (or current) determined for the first conductor would be applied to Q, for example, with the inverse voltage (or current) applied to a second conductor Q'. Similarly, the voltage (or current) determined for each of the remaining n−1 conductors along with an associated inverse voltage (or current) would be applied to a corresponding pair of conductors. While this implementation requires twice as many conductors, it still reduces the number of conductors required relative to various conventional signaling strategies. In addition, this implementation facilitates use of signaling strategies according to the present disclosure with existing networking infrastructure, such as used in Ethernet applications, for example.

Receive-Side Implementation for Multi-Phase Wired Signaling

Figure 8:
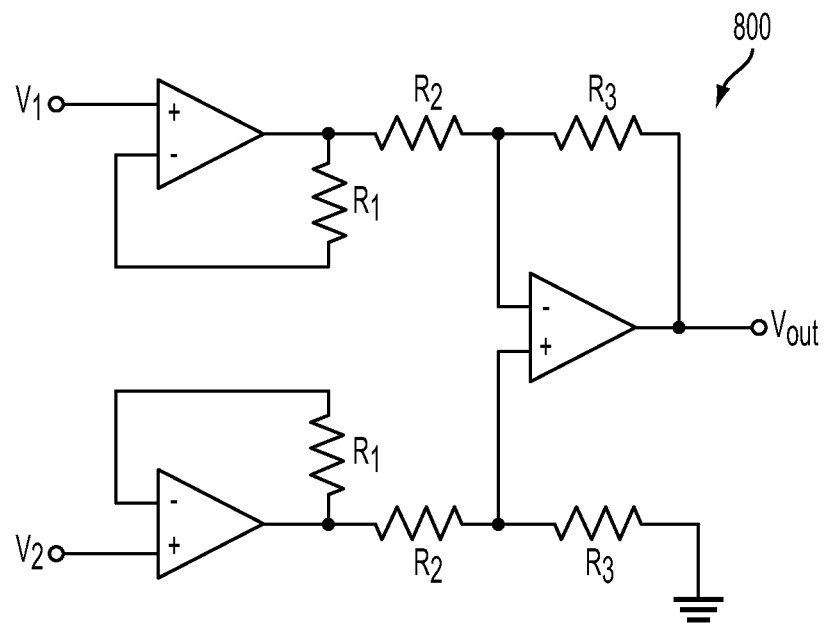
FIG. 8 is a diagram illustrating a representative embodiment of circuitry for generating a differential voltage in a receiver/detector device for multi-phase wired signaling according to the present disclosure.

FIG. 8 is a diagram illustrating a representative embodiment of a receiver/detector device including circuitry for multi-phase wired signaling according to the present disclosure. Those of ordinary skill in the art will recognize that there are many possible strategies for decoding specific voltages or currents on the conductors within a signaling cluster according to the present disclosure. For example, high-impedance comparators can be used to quickly determine an approximate voltage/current of an associated conductor. A precise determination of the voltage/current is generally not required in a digital signaling strategy as disclosed here. Another approach would use low-bit flash analog-to-digital (ADC) convertors to quickly determine the voltage/current values. While comparing each conductor independently to a series of references/thresholds may also be suitable in a limited number of applications, this approach is more susceptible to common-mode noise spikes coupled onto the conductors. As such, various embodiments according to the present disclosure use a differential voltage/current comparison of one or more pairs of conductors within a signaling cluster to multiple thresholds/reference values.

FIG. 8 illustrates one embodiment of circuitry for a receiving device that may be used to generate a differential voltage between a pair of conductors of a signaling cluster. Circuitry 800 operates as a differential amplifier or differential voltage follower when resistor values for $R_1$, $R_2$, and $R_3$ are substantially identical. A tri-phase wired signaling system as described above would include three such differential amplifiers 800 to generate the differences for QR, RS, and SQ pairs. For example, in the first amplifier, conductor Q connects to $V_2$ and conductor R to $V_1$ such that $V_{out}$ generates the differential voltage values in the QR column of the above table. In the second amplifier, conductor S connects to $V_2$ and conductor Q connects to $V_1$, such that $V_{out}$ produces the differential voltage values in the SQ column of the above table. In the third amplifier, conductor R connects to $V_2$ and conductor S connects to $V_1$, such that $V_{out}$ produces the differential voltage values in the RS column of the above table. Note that QR, RS, and SQ also sum to zero. Any deviation from zero indicates errors in one or more of Q, R, S, and can be used to adjust calibration for robustness.

The differential voltage values of the QR, SQ, and RS columns in the above table may be used to determine comparator values which can uniquely identify a bit encoding based on the values from the three differential amplifiers. For example, in the embodiment illustrated in the table of FIG. 10, the following 24 reference/threshold comparator voltages are selected: −1.7, −1.55, −1.4, −1.25, −1.1, −0.95, −0.8, −0.65, −0.5, −0.35, −0.2, −0.05, 0.05, 0.2, 0.35, 0.5, 0.65, 0.8, 0.95, 1.1, 1.25, 1.4, 1.55, and 1.7.

Figure 9:
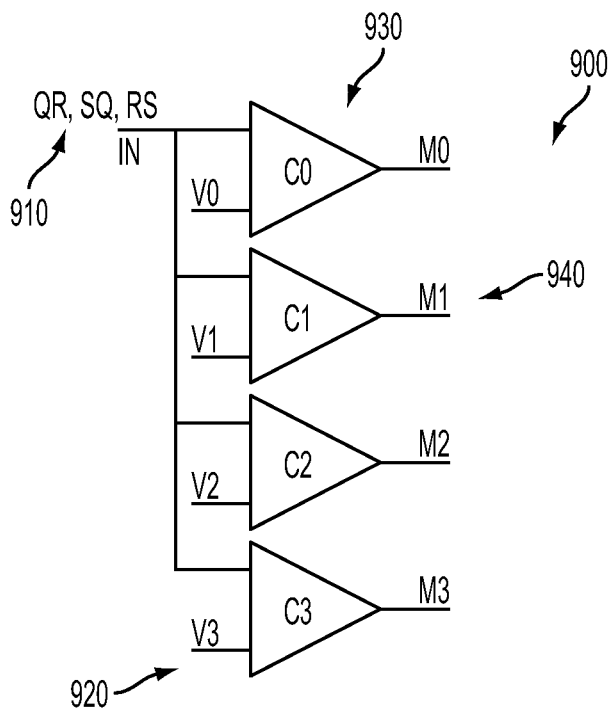
FIG. 9 is a diagram illustrating a representative embodiment of circuitry for comparing voltages to a plurality of thresholds and generating a binary match pattern for a receiver/detector device for multi-phase wired signaling according to the present disclosure.

FIG. 9 is a diagram illustrating a representative embodiment of circuitry for comparing differential voltages to a plurality of thresholds and generating a binary match pattern for a receiver/detector device for multi-phase wired signaling according to the present disclosure. Circuitry 900 includes a bank of comparators 930 that operates to compare the differential voltages or currents between at least one pair of conductors within a signaling group. In this example, differential voltages associated with the first and second conductors (QR), third and first conductors (SQ), and second and third conductors (RS) are compared to associated reference values or thresholds 920 to generate match bits 940 that form a binary match pattern used to decode the digital data. Match bits 940 (M0 . . . M3) create a digital representation or estimate of the value on the given differential output. In general, it is possible to obtain a unique set of detection values or match pattern using less than the number of symbols of the signaling strategy. Stated differently, detection can be accomplished with a number of thresholds or comparators that is less than the number of permutations of the multiple-bit binary pattern. In the representative embodiment described above, the five-bit binary pattern includes 32 permutations or symbols that are detected using 24 reference/threshold comparators, although a smaller or better optimized number may be possible depending on the particular application and implementation.

Although one bank of comparators 930 having four comparators is illustrated in FIG. 9, actual implementations may include a dedicated bank of comparators 930 for each pair of conductors of the signaling cluster or group that are used in a particular application, with each bank having a number of comparators less than the number of symbols in the signaling strategy. The number of pairs of conductors used may be selected to achieve desired performance characteristics for a particular application or implementation. For example, as described and illustrated in greater detail with respect to one representative embodiment below, a four-conductor signaling cluster provides six available pairs with only four of the pairs selected.

In a representative tri-phase signaling strategy with three signaling conductors, a separate bank of comparators 930 may be provided for each differential voltage pair 910 corresponding to the differential voltages QR, SQ, and RS. Similarly, comparator bank 930 would include a comparator for each selected threshold or reference voltage 920. In this example, a bank of 24 comparators would be used, only four of which are illustrated in FIG. 9. Each comparator 930 compares the voltage (QR, SQ, or RS) on one input to an associated threshold (V0-V3) to generate a corresponding match bit (M0-M3) when the input voltage exceeds the threshold. The match bits 940 create a match pattern or match set as illustrated in the table above. As such, circuitry as illustrated in FIG. 9 can be used to generate a binary match pattern for each selected pair of conductors with each bit of the binary match pattern associated with one of the plurality of thresholds 920. The binary match pattern is then used to determine the corresponding digital data or unique multiple-bit binary pattern. In one embodiment, the maximum and minimum number of asserted bits in the binary match pattern of all of the pairs of the conductors may be used to determine the corresponding digital data, although other techniques may also be used as described in greater detail below.

FIGS. 10A-10C illustrate operation of a system or method for decoding data in response to received differential voltages/currents in a poly-phase wired signaling strategy having three signaling lines according to various embodiments of the present disclosure. As previously described, each signaling line may be implemented by a single conductor, or may be implemented by two conductors operating as a differential pair. In the latter case, a first conductor of the differential pair has a voltage/current as shown in the table, and the second conductor has the inverse voltage/current.

The values in this example correspond to a 32-symbol signaling strategy similar to the embodiment previously described. However, the constellation diagram used in the present example has symbol location/coordinates beginning at a phase of 30° and generally equally spaced at 45° intervals, which results in phases of 30°, 75°, 120°, 165°, 210°, 255°, 300°, and 345°. In addition, rather than 24 comparator voltages or thresholds, only 12 detection thresholds are used in corresponding banks of 12 comparators for each of the differential selected voltage pairs QR, SQ, and RS. In this representative embodiment, comparator voltage thresholds are: −1.4, −1.18, −1, −0.55, −0.28, −0.05, 0.05, 0.28, 0.55, 1, 1.18, and 1.4. This design results in similar robustness as the embodiment previously described, but reduces the receive-side circuitry by about one-half.

As with the previously described embodiment, this embodiment associates digital data represented by the data bits in the table below with corresponding unique two-dimensional coordinates representing amplitude and phase of a periodic waveform having a period of 360 degrees. The amplitude and phase are converted to a first corresponding voltage and applied to a first signaling line, corresponding to a first conductor or differential pair (Q) as shown in the table of FIG. 10A. Similarly, the amplitude and phase are converted to a second corresponding voltage based on a value of the periodic waveform phase shifted by 120 degrees relative to the amplitude and phase, with the second voltage applied to a second signaling line implemented by a conductor or differential pair of conductors (R) as shown in the corresponding column labeled "R(+120)". Likewise, the amplitude and phase are converted to a third corresponding voltage based on a value of the periodic waveform phase shifted by 240 degrees (or −120 degrees) relative to the amplitude and phase and applied to a third signaling line implemented by a conductor or differential pair (S) as represented by the values in the column labeled "S(−120)". As illustrated by the table of FIG. 10A, the first, second, and third voltages for a particular symbol sum to substantially zero. The differential voltages for each pair of signaling lines (QR, SQ, and RS) is compared to a plurality of thresholds, (12 in this example) to decode the associated digital data word in the column labeled "Bits" of FIG. 10B. As indicated in the table, the digital data comprises a multiple-bit binary word having "n" bits (5 in this example) and the number of thresholds (12) is less than $2^n$ or 32.

FIG. 10B illustrates operation of three banks of 12 comparators each used to generate match patterns and decode the associated multiple-bit data words. The values from the bank of comparators 930 at the receiver attached to the QR differential voltage (or current) are represented by the match pattern in the column labeled "QR Match Set." Similarly, the values for the comparators attached to the SQ differential voltage (or current) are represented by the match pattern data in the column labeled "SQ Match Set." Likewise, the values for the comparators attached to the RS differential voltage (or current) are represented by the match pattern data in the column labeled "RS Match Set." Each of the match patterns in the "Match Set" columns includes asserted bits, represented by 1's in this embodiment, and/or non-asserted bits, represented by 0's in this embodiment, based on the asserted match bits 940 for the thresholds or voltages exceeded or "matched" by the differential voltage associated with a particular received symbol/coordinate. Values in the column labeled "qr1" represent the number of asserted bits or 1's in the QR match set. Values in the column labeled "sq1" represent the number of asserted bits or 1's in the SQ match set. Values in the column labeled "rs1" represent the number of asserted bits or 1's in the RS match set. Values in the column labeled "Max" represent the maximum number of asserted match bits (1's in this example, although the inverse logic is equally applicable) across all of the selected pairs of conductors, QR, SQ, and RS in this example. Similarly, values in the column labeled "Min" represent the minimum number of asserted match bits (1's) for all of the selected pairs of signaling lines (single conductors or differential pairs) in the signaling group or cluster. The table of FIG. 10C provides a sorted list of values for qr1, sq1, and rs1.

As illustrated in the tables of FIGS. 10A-10C, the n-tuple or triplets formed by <qr1,sq1,rs1> entries are unique across all 32 rows. This permits directly mapping to a specific bit pattern or data word when decoding the received signal based on the number of asserted (or non-asserted) bits in the match pattern. Alternatively, the maximum and minimum number of asserted (or non-asserted) bits may be used to decode the received signal. While there are multiple rows where the same Max/Min values exist, there is always a unique triplet or n-tuple representing the number of asserted bits in each match pattern associated with a signaling line pair that may be used to uniquely identify the associated bit pattern or data word for the otherwise ambiguous Max/Min combinations. As such, Max/Min values may be used in combination with the number of asserted (or non-asserted) bits to decode the signal and uniquely identify an associated bit pattern or data word. Of course, the comparator thresholds and/or number of thresholds may also be selected such that the Max/Min n-tuple or pairings are unique across all symbols, if desired, such that Max/Min could be used to uniquely identify a particular data word or bit pattern.

As also illustrated in the table of FIG. 10B, the column labeled "Del+" includes values analogous to conventional "eye" spacing for detection of the given row using the difference between the maximal 1's span and the minimal 1's span for that row. The spacing is based on the average spacing of the selected comparator voltages/thresholds, which in this example are approximately 0.15 volt per comparator. Similarly, the column labeled "Del−" includes values analogous to the "eye" spacing if the maximal span is just over the last '1' comparator detection threshold, while the minimal span is just under the first '0' comparator threshold, which reduces the "eye" by about 0.15 in this example. As illustrated in the table of FIG. 10B, for this example, there is at least 0.15 volt separation for the worst case "eye" values and typically 0.3 volt separation, which is readily detectable in a digital system using common-mode noise rejection as in this approach.

A 2-Bit-Per-Transition Tri-Phase Example

In another embodiment of a wired 4-symbol multi-phase signaling strategy, a simpler design achieves 2-bits-per-transition in a constant amplitude four-station strategy. A periodic waveform implemented by a VSW having an amplitude of unity and phases of 0°, 90°, 180°, and 270° may be used to generate the voltages and bit encodings as illustrated in the following table.

| Amp | Phase | Encoding | Q | R (+120) | S (−120) | R−Q (QR) | S−Q (SQ) | R−S (RS) |
|---|---|---|---|---|---|---|---|---|
| 1 | 0 | 00 | 0.000 | 0.866 | −0.866 | −0.866 | −0.866 | 1.732 |
| 1 | 90 | 01 | 1.000 | −0.500 | −0.500 | 1.500 | −1.500 | 0.000 |
| 1 | 180 | 10 | 0.000 | −0.866 | 0.866 | 0.866 | 0.866 | −1.732 |
| 1 | 270 | 11 | −1.000 | 0.500 | 0.500 | −1.500 | 1.500 | 0.000 |

From this table it can be readily seen that using three wires and four states, it is trivial to decode each of the four states, with significant noise margin from state to state and also within a given state. When the RS differential voltage is zero (for encodings/digital data of 01 and 11), for example, the QR and SQ differential voltages readily distinguish between the two and eliminate any ambiguity.

This simple encoding is readily implemented in both the transmit device and the receive device, and eliminates a wire/conductor compared to a conventional 2-bit differential pair system. Furthermore, this embodiment retains the constant-power-per-bit and noise immunity of a conventional differential pair system, while reducing the number of conductors by 25%. Because the I/O is generally the limiting factor in modern high-speed designs, the moderate additional circuitry to encode and decode the data using this signaling strategy will be more than offset by the savings in chip area required for I/O bond-pads and wire connections in many applications.

A 5-Bit-Per-Transition Quad-Phase Example

A common wiring system known as "Star-Quad" consists of a twisted quartet of wires. Another embodiment of the present invention can be used over such wiring to achieve significant bandwidth improvement over an equivalent wiring of two twisted pairs carrying two standard differential binary signals. Operation of this embodiment is illustrated and described with reference to FIGS. 11A-11C. In this embodiment, a 32-symbol constellation diagram is used with each station assigned one of four amplitudes of 0.25, 0.5, 0.75, and 1.0 and one of eight phases corresponding to radials spaced at thirty degrees as in the previous embodiment. Encoding is performed using four virtual periodic waveforms each having different amplitudes, which correspond to the amplitudes used in the constellation diagram in this example, but may be assigned or scaled based on the system voltage/current levels as previously described. The virtual periodic waveforms are then used to determine a corresponding voltage (or current) to be applied to an associated signaling line, which may be implemented by a single conductor or by a differential pair as previously described. Each voltage (or current) value is determined based on the value of the periodic waveform at a reference point, and then phase shifted by +90 degrees (R), +180 degrees (S), and −90 degrees (T) analogous to the previously described embodiments. The four signaling lines (Q, R, S, and T) are used to generate four differential values (QR, RS, ST, and TQ) corresponding to at least one selected signaling line pair. Those of ordinary skill in the art will recognize that the four signaling lines (Q, R, S, and T) have six available signaling line pairs (QR, QS, QT, RS, RT, and ST). One or more signaling line pairs may be selected for use in generating the differential values depending on the particular application and implementation.

In the representative embodiment illustrated in FIGS. 11A-11C, comparator values/voltages of −1.4, −1.18, −1.0, −0.7, −0.4, −0.1, 0.1, 0.4, 0.7, 1.0, 1.18, and 1.4 result in the match pattern data represented by the match sets illustrated in FIG. 11B. Analogous to the three-wire embodiment, the sum of QR, RS, ST, and TQ is zero, and the 4-tuple or quartet <qr1, rs1, st1, tq1> is unique for each bit encoding as illustrated by the sorted table entries of FIG. 11C. Using the same number of wires as two differential pairs, five bits are transmitted in the same amount of time as two bits with conventional differential signaling.

Figure 12:
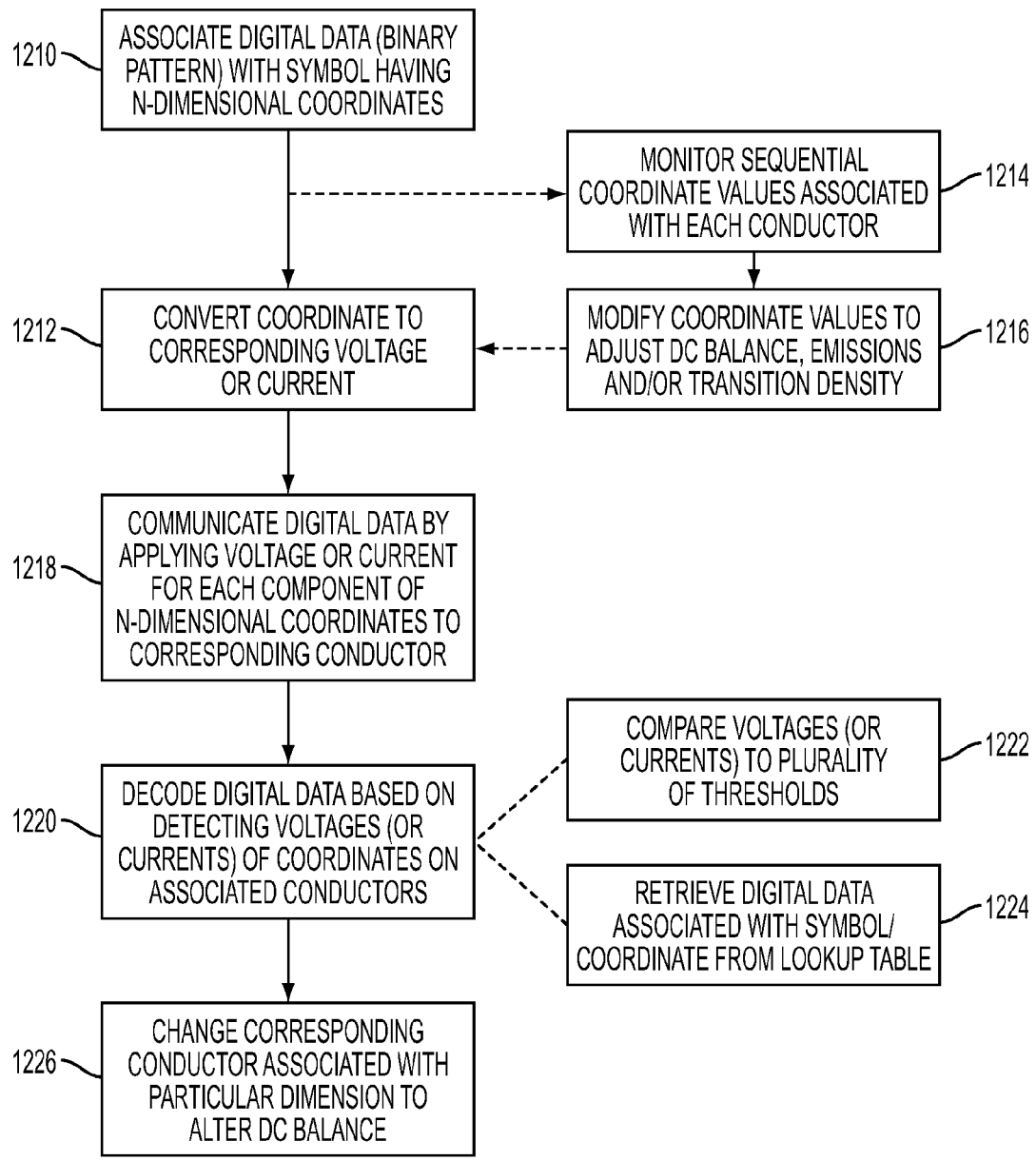
FIGS. 12 and 13 are diagrams illustrating operation of various representative embodiments of a system or method for digital signaling according to the present disclosure.
Figure 13:
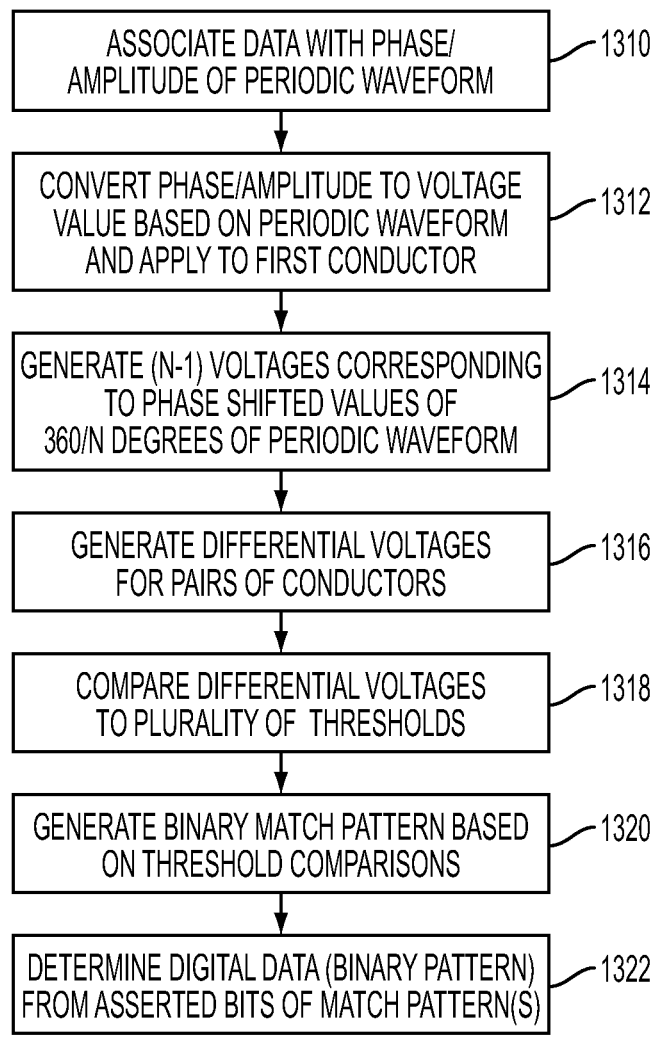

FIGS. 12 and 13 are diagrams illustrating operation of various representative embodiments of a system or method for digital signaling according to the present disclosure. Those of ordinary skill in the art will recognize that the functions represented in the diagrams may be performed by various types of devices, including software, firmware, and/or hardware devices. Depending upon the particular application and implementation, various functions may be performed by circuitry implemented using discrete components and/or integrated circuit components. As such, the various functions may be performed in an order or sequence other than illustrated in the Figures. Similarly, one or more steps or functions may be repeatedly performed, or omitted, although not explicitly illustrated. As previously described, reference to a conductor should be understood to include a signaling line that may be implemented by a single conductor, or by a pair of conductors functioning as a differential signaling pair.

As generally represented by block 1210, a system or method for multi-phase digital signaling includes associating digital data (represented by a unique multiple-bit binary pattern, for example) with corresponding unique n-dimensional coordinates for each of a plurality of binary patterns. The coordinates may represent selected or assigned symbol locations of a constellation diagram, for example. In one embodiment, associating digital data includes assigning n-dimensional coordinates that maximize distance between adjacent pattern coordinates within an associated voltage or current range of the integrated circuit chip. The system or method includes converting each coordinate of the n-dimensional coordinates to a corresponding voltage or current as represented by block 1212. The system or method may optionally include monitoring a series of sequential coordinate values associated with each conductor as represented by block 1214 and modifying the coordinate values to adjust at least one of DC balance, radiated emissions, and transition density associated with the series of sequential coordinate values before converting each coordinate to a corresponding voltage or current as generally represented by block 1216. Modifying the coordinate values may include encoding a stream of coordinates associated with each signaling line using a line code before converting the coordinates to corresponding voltages or currents.

As also shown in FIG. 12, the system or method include communicating the multiple-bit binary pattern by applying each voltage or current associated with the n-dimensional coordinates to a corresponding conductor of a group of "n" conductors, wherein the number "n" of conductors is less than the number of bits of each multiple-bit binary pattern, as generally represented by block 1218. As represented by block 1220, the system or method include decoding the multiple-bit binary pattern associated with the n-dimensional coordinates based on detecting the voltages or currents of the "n" conductors. Decoding the digital data may optionally include comparing the voltages or currents to a plurality of thresholds to determine a corresponding coordinate value as represented by block 1222. Likewise, decoding the digital data may optionally include using the n-dimensional coordinates to retrieve an associated unique multiple-bit pattern from a lookup table as represented by block 1224. The system or method may also include changing the corresponding conductor associated with a particular dimension of the n-dimensional coordinates to alter DC balance across the group of "n" conductors as represented by block 1226.

As illustrated in the diagram of FIG. 13, in one embodiment a system or method for multi-phase signaling includes associating digital data with corresponding n-dimensional coordinates or locations wherein the n-dimensional coordinates are two-dimensional coordinates representing amplitude and phase of a periodic waveform as generally represented by block 1310. As previously described, the amplitude and phase coordinates are converted to a first voltage or current that is applied to a first signaling conductor as represented by block 1312. The system or method then includes generating (n−1) voltages or currents each corresponding to values of the periodic waveform at phases of about 360/n degree intervals as represented by block 1314. As those of ordinary skill in the art will recognize, the first and (n−1) voltages or currents are applied substantially simultaneously to corresponding conductors for each symbol to transmit or communicate the digital data.

Detection and decoding of transmitted digital data begins by generating differential voltages or currents for at least one pair of the conductors as represented by block 1316. The system or method continue by comparing each differential voltage or current to a plurality of thresholds to select the corresponding unique multiple-bit binary pattern (digital data) as represented by block 1318. In one embodiment, the number of thresholds is less than the number of permutations of the multiple-bit binary pattern, i.e. for a 4-bit binary pattern the number of thresholds would be less than 16.

As also shown in the diagram of FIG. 13, detecting the transmitted n-dimensional coordinates and associated digital data may include generating a binary match pattern for each of the at least one selected pair of the conductors with each bit of the binary match pattern associated with one of the plurality of thresholds as represented by block 1320. The system or method may also include determining a corresponding unique multiple-bit binary pattern (digital data) based on a number of asserted bits in the binary match patterns of all of the selected pairs of the conductors as represented by block 1322. In one embodiment, the maximum and minimum numbers of asserted bits associated with the selected pairs of conductors within a particular symbol period are used to determine a corresponding digital data word. Alternatively, the number of asserted bits in match patterns associated with each selected pair is used to differentiate between otherwise ambiguous maximum/minimum values. This may include accessing a look-up table indexed by the number of asserted bits and/or the maximum and minimum number of asserted bits with the output corresponding to the associated digital data (unique multiple-bit pattern).

Those of ordinary skill in the art will recognize that the embodiments of the present disclosure demonstrate that the multi-phase signaling strategy described, with little or no optimization, provides a robust mechanism for decoding five bits or two bits per transition over three conductors. This provides a significant improvement relative to conventional differential pair signaling. For example, in a conventional different pair strategy with a single bit per transition, six conductors are used to transmit three bits per transition. In contrast, using a multi-phase signaling strategy according to the present disclosure enables transfer of ten data bits per transition in a five-bit-per-symbol implementation, or four data bits per transition in a two-bit-per-symbol design, for a bit density increase of over 300% in the five-bit strategy and a bit density increase of 33% in the two-bit strategy. This comes at the expense of a moderate amount of additional circuitry for encoding and decoding.

For IC chip implementations, every differential pair already has effectively a driver per I/O conductor. For the multi-phase signaling embodiments described above, the resistors needed to form the R-2R ladder switches, or to create the desired voltage values for the CMOS pass-gate implementation require very little area. Pass-gates are similarly small, low-current devices, so there is minimal impact on the transmit side.

On the receive side, the representative example uses one differential amplifier per conductor pair, which is analogous to the differential receiver in a conventional differential pair signaling strategy. As such, the representative embodiments of a signaling strategy according to the present disclosure result in a 50% increase in the number of amplifiers. For example, in the six-wire comparison described above, nine amplifiers would be used in the multi-phase signaling strategy with one amplifier for each pair of conductors as compared to only six for a conventional differential pair strategy. This would require about 50% more IC chip area to accommodate the additional amplifiers.

The bank of comparators associated with each differential amplifier is unique to the multi-phase signaling embodiments. In addition, the binary match sets may use a simple look-up table or other device with 32 entries to provide the 32-to-5 bit lookup symbol decoding function and identify the corresponding five-bit digital data value. However, all of this circuitry is fast and small and should not be a significant deterrent to widespread adoption. Furthermore, optimization of the threshold match voltages can produce a design that uses significantly fewer comparators.

In an alternative embodiment suitable for applications where more noise or EM interference is present, the direct-match function of the comparators and pattern matching bits can be replaced by a statistical similarity match similar to PRML (Partial Response Maximum Likelihood) techniques to extract the most probable symbol and associated 5-bit data, for example.

The resulting design with the five-bit-per-transition approach provides a system which is capable of matching existing differential-pair transmission speeds, but provides over three times the number of bits per I/O pad on an integrated circuit. With the two-bit-per-transition approach, a 33% increase is achieved.

With a small amount of rework, a 10 gigibit-per-second design becomes a 50 gigibit-per-second design at the same clock speeds. A gigabit Ethernet readily becomes a five gigabit network.

A 15-bit differential bus, with 30 wires, capable of transferring 15 bits per transition using conventional differential signaling, becomes a set of 10 tri-phase signaling groups or clusters (30 wires), each transferring five bits in this example, resulting in a capacity of fifty bits per transition. Conversely, the same 15-bit bus with 30 wires could be replaced with three tri-phase groups requiring only nine wires for 15 bits instead of the thirty required for differential signaling, such that the remaining 21 wires and I/O pads are available to expand the chip design. Furthermore, with additional precision on the voltages and the decoding, the constellation size could readily be increased beyond the demonstrated 32 stations.

Tri-phase wired signaling according to the present disclosure retains many of the advantages associated with conventional differential pair signaling, such as constant power (for a given amplitude), for example. In addition, a driving amplifier design that preserves constant power across amplitude changes can be created, providing a significant reduction in switching transients associated with data transfer from one integrated circuit to another. Backplanes and card connectors, also a bottleneck source, could be redesigned to use wire triplets, with either significant reduction in connector pin count, significant increase in bandwidth over the same size connector, or a combination of both.

Those of ordinary skill in the art will recognize that use of multi-phase wired signaling according to the present disclosure at slower switching speeds, with each wire representing one dimension in an N-dimensional constellation, and each dimension represented by K values, an N-wire system can carry $K^N$ values instead of $2^N$ values provided by existing digital systems. If K is eight ($2^3$), for example, the N-wire capacity becomes $2^{3N}$ on the same N-wire bus. An 8-wire bus can now carry $2^{24}$ values instead of only $2^8$. Existing differential-pair style connectors and backplanes can still be used, with slower switching speeds due to the increased bit carrying capacity over the same conductors. A 10 gigabit design requiring a 64-bit bus clocked at 156.25 MHz could be redesigned with K=8 and a voltage range of +2 to −2V (2.0, 1.43, 0.857, 0.286, −0.286, −0.857, −1.43, −2.0) so that each pair carries three bits per transition instead of a single bit. The same 10 gigabit rate could be achieved with either ⅓ of the wires at the same clock rate, or the same number of wires could be used and the clock rate reduced by ⅓ to about 53 MHz, significantly reducing radiated emissions.

As can be seen by the embodiments illustrated and described above, systems and methods for wired signaling according to the present disclosure may provide a number of advantages and facilitate a substantial increase in the input/output capacity in a number of applications including integrated circuits, such as microprocessors, without consuming significant on-chip resources or power budgets. Likewise, embodiments according to the present disclosure may provide an order of magnitude or more increase in I/O data rates over chip-to-chip busses without an increase in pin count or significant increases in power budget. As such, embodiments of the present disclosure facilitate a significant increase in chip-to-chip or component-to-component available bandwidth, with an associated significant increase of the processing capability of microprocessors and other integrated circuits. The communication of multiple bits of information using a single symbol represented by n-dimensional coordinates facilitates a reduction in the signal edge rates and a corresponding reduction in radiated emissions. Embodiments that permit only one wire of a signaling group or cluster to change state at a time may also reduce radiated emissions. Embodiments may include a ground wire or conductor associated with each signaling cluster to reduce or eliminate coupling of signals between adjacent signaling clusters. Using signaling strategies according to the present disclosure addresses the I/O bottleneck encountered by parallel high-speed systems and provides a path forward that will limit the influence of I/O pad size from being the integrated circuit bottleneck for the foreseeable future.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention. Similarly, while the best mode has been described in detail with respect to particular embodiments, those familiar with the art will recognize various alternative designs and embodiments within the scope of the following claims. While various embodiments may have been described as providing advantages or being preferred over other embodiments with respect to one or more desired characteristics, as one skilled in the art is aware, one or more characteristics may be compromised to achieve desired system attributes, which depend on the specific application and implementation. These attributes may include, but are not limited to: cost, strength, durability, life cycle cost, marketability, appearance, packaging, size, serviceability, weight, manufacturability, ease of assembly, etc. The embodiments described herein that are characterized as less desirable than other embodiments or prior art implementations with respect to one or more characteristics are not outside the scope of the disclosure and may be desirable for particular applications.

What is claimed is:

1. A method for digital signaling over a group of "n" conductors, comprising:
    associating a unique multiple-bit binary pattern with corresponding unique n-dimensional coordinates for each of a plurality of patterns;
    converting each coordinate of the n-dimensional coordinates to a corresponding voltage or current;
    communicating the multiple-bit binary pattern by applying each voltage or current associated with the n-dimensional coordinates to a corresponding conductor of the group of "n" conductors, wherein the number "n" of conductors is less than the number of bits of each multiple-bit binary pattern.

2. The method of claim 1 further comprising:
    decoding the multiple-bit binary pattern associated with the n-dimensional coordinates based on detecting the voltages or currents of the "n" conductors.

3. The method of claim 2 wherein decoding comprises:
    comparing the voltages or currents to a plurality of thresholds to determine a corresponding coordinate value; and
    using the n-dimensional coordinates to retrieve an associated unique multiple-bit pattern from a lookup table.

4. The method of claim 1 further comprising:
    encoding a stream of coordinates associated with each conductor using a line code before converting the coordinates to corresponding voltages or currents.

5. The method of claim 1 further comprising:
    changing the corresponding conductor associated with a particular dimension of the n-dimensional coordinates to alter DC balance across the group of "n" conductors.

6. The method of claim 1 further comprising:
    monitoring a series of sequential coordinate values associated with each conductor; and
    modifying the coordinate values to adjust at least one of DC balance, radiated emissions, and transition density associated with the series of sequential coordinate values before converting each coordinate to a corresponding voltage or current.

7. The method of claim 1 wherein associating a unique multiple-bit binary pattern comprises assigning n-dimensional coordinates that maximize distance between adjacent pattern coordinates within an associated designated voltage or current range.

8. The method of claim 1 wherein the conductors comprise matched impedance conductors.

9. The method of claim 1 wherein communicating the multiple-bit binary pattern comprises applying each voltage or current to on-chip conductive traces of an integrated circuit chip having substantially matched impedance and extending between integrated circuit components.

10. The method of claim 9 wherein the on-chip conductive traces are positioned between ground plane layers of the integrated circuit chip.

11. The method of claim 1 wherein the number "n" of conductors corresponds to the number of coordinates in each n-dimensional coordinate.

12. The method of claim 1 wherein each conductor has an associated secondary conductor, the method further comprising applying an inverse voltage or current to the secondary conductor such that each conductor and its associated secondary conductor function as a differential signaling pair.

13. The method of claim 1 wherein each n-dimensional coordinate includes "n" components each corresponding to one dimension, and wherein converting comprises converting each component to a corresponding voltage or current.

14. The method of claim 1 wherein the n-dimensional coordinates are two-dimensional coordinates representing amplitude and phase of a periodic waveform having a period of 360 degrees, the number "n" of conductors is greater than two, and converting each coordinate includes converting the amplitude and phase to a first voltage or current, the method further comprising:
    generating (n−1) voltages or currents each corresponding to values of the periodic waveform at phases of about 360/n degree intervals;
    wherein each of the first and (n−1) voltages or currents is applied substantially simultaneously to the corresponding conductor of the group of "n" conductors for each symbol.

15. The method of claim 14 wherein the voltages or currents associated with each symbol sum to substantially zero.

16. The method of claim 14 wherein the periodic waveform comprises a sinusoid.

17. The method of claim 14 further comprising:
    generating differential voltages or currents for at least two pairs of the conductors;
    comparing each differential voltage or current to a plurality of thresholds to select the corresponding unique multiple-bit binary pattern.

18. The method of claim 17 wherein the number of thresholds is less than the number of permutations of the multiple-bit binary pattern.

19. The method of claim 17 wherein comparing comprises:
    generating a binary match pattern for at least two pairs of the conductors with each bit of the binary match pattern associated with one of the plurality of thresholds;

determining the corresponding unique multiple-bit binary pattern based on a number of asserted bits in the binary match pattern of at least one of the pairs of the conductors.

20. The method of claim 1 wherein associating the unique multiple-bit binary pattern comprises associating binary patterns such that adjacent symbols have binary patterns that differ by only one bit.

21. A method for communicating digital data between components connected by first, second, and third conductors, comprising:
- associating the digital data with corresponding unique two-dimensional coordinates representing amplitude and phase of a periodic waveform having an associated period;
- converting the amplitude and the phase to a first corresponding voltage or current and applying the voltage or current to the first conductor;
- converting the amplitude and the phase to a second corresponding voltage or current based on a value of the periodic waveform phase shifted by one-third of the period relative to the amplitude and the phase and applying the second corresponding voltage or current to the second conductor; and
- converting the amplitude and the phase to a third corresponding voltage or current based on a value of the periodic waveform phase shifted by two-thirds of the period relative to the amplitude and the phase and applying the third corresponding voltage or current to the third conductor.

22. The method of claim 21 further comprising:
comparing differential voltage or current between pairs of the first, second, and third conductors to a plurality of thresholds to decode the digital data.

23. The method of claim 22 wherein the digital data comprises a multiple-bit binary word having "n" bits and wherein the plurality of thresholds is less than $2^n$.

24. The method of claim 21 further comprising:
comparing differential voltage or current between first and second conductors, third and first conductors, and second and third conductors to a plurality of thresholds to generate corresponding binary match patterns having a bit for each threshold; and
decoding the digital data based on the binary match patterns.

25. The method of claim 24 wherein decoding comprises determining the unique combinations of number of asserted bits for one or more of the binary match patterns.

26. The method of claim 24 further comprising retrieving stored digital data based on the binary match patterns.

27. The method of claim 21 wherein the first, second, and third corresponding voltages or currents sum to substantially zero.

28. A system for communicating digital data associated with amplitudes and phases of a periodic waveform having a period of 360 degrees between components connected by a plurality of n conductors, comprising:
circuitry that converts a first amplitude and a first phase to a first corresponding voltage or current and applies the first corresponding voltage or current to a first one of the plurality of conductors, and converts the first amplitude and the first phase to (n−1) corresponding voltages or currents based on amplitudes of the periodic waveform phase shifted by about m*(360/n) relative to the first phase where m is indexed from one to (n−1) and applies each corresponding voltage or current to an associated conductor of the plurality of conductors.

29. The system of claim 28 wherein the voltages or currents applied to the plurality of conductors sum to substantially zero.

30. The system of claim 28 further comprising:
circuitry that compares voltage or current of each of the plurality of n conductors to a plurality of thresholds; and
circuitry that selects one of a plurality of predetermined digital data in response to a number of the thresholds exceeded.

31. The system of claim 30 further comprising:
circuitry that generates a differential voltage or current for greater than one unique pairing of the plurality of n conductors, wherein the circuitry that compares voltage or current compares the differential voltage or current.

* * * * *